(12) United States Patent
Murakami et al.

(10) Patent No.: US 11,014,168 B2
(45) Date of Patent: May 25, 2021

(54) SURFACE-COATED CUTTING TOOL WITH EXCELLENT ADHESION-INDUCED CHIPPING RESISTANCE AND PEEL RESISTANCE

(71) Applicant: MITSUBISHI MATERIALS CORPORATION, Tokyo (JP)

(72) Inventors: Akihiro Murakami, Tokyo (JP); Hitoshi Kunugi, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 114 days.

(21) Appl. No.: 16/322,986

(22) PCT Filed: Aug. 7, 2017

(86) PCT No.: PCT/JP2017/028560
§ 371 (c)(1),
(2) Date: Feb. 4, 2019

(87) PCT Pub. No.: WO2018/030329
PCT Pub. Date: Feb. 15, 2018

(65) Prior Publication Data
US 2019/0176242 A1    Jun. 13, 2019

(30) Foreign Application Priority Data

Aug. 9, 2016   (JP) .............................. JP2016-156161

(51) Int. Cl.
*B32B 27/14* (2006.01)
*B23B 27/14* (2006.01)
(Continued)

(52) U.S. Cl.
CPC ............ *B23B 27/148* (2013.01); *B23B 27/14* (2013.01); *C23C 16/36* (2013.01); *C23C 16/403* (2013.01); *B23B 2224/32* (2013.01)

(58) Field of Classification Search
CPC ..... B23B 27/14; B23B 2224/32; C23C 16/36; C23C 16/403
(Continued)

(56) References Cited

U.S. PATENT DOCUMENTS

| 5,436,071 A | 7/1995 | Odani et al. |
| 2004/0161639 A1 | 8/2004 | Fukano et al. |

(Continued)

FOREIGN PATENT DOCUMENTS

| CN | 104044308 A | 9/2014 |
| CN | 103459070 B | 1/2016 |

(Continued)

OTHER PUBLICATIONS

International Search Report dated Sep. 19, 2017, issued for PCT/JP2017/028560.
(Continued)

*Primary Examiner* — Archene A Turner
(74) *Attorney, Agent, or Firm* — Locke Lord LLP

(57) ABSTRACT

In the surface-coated cutting tool, a Ti compound layer containing at least nitrogen and carbon is formed on a surface of cutting tool substrate, a nitrogen concentration in the Ti compound layer, in a case of being measured in a direction perpendicular to the surface of the cutting tool substrate in a vicinity of a cutting edge, gradually increases as a distance from cutting tool substrate increases within a range of 0.20 μm from the surface of the cutting tool substrate toward the Ti compound layer, an average concentration gradient of the nitrogen concentration is 20 at %/μm or more and 300 at %/μm or less, and an average nitrogen concentration in the Ti compound layer in the vicinity of the cutting edge is lower than an average nitrogen concentration in the Ti compound layer at a position of a flank face away from the cutting edge by 3 at % or more.

7 Claims, 2 Drawing Sheets

(51) Int. Cl.
*C23C 16/36* (2006.01)
*C23C 16/40* (2006.01)

(58) Field of Classification Search
USPC .......................... 51/307, 309; 428/467, 698
See application file for complete search history.

(56) References Cited

U.S. PATENT DOCUMENTS

| | | | |
|---|---|---|---|
| 2011/0206470 A1* | 8/2011 | Waki | C23C 14/505 |
| | | | 407/119 |
| 2014/0017469 A1* | 1/2014 | Fukunaga | C23C 30/005 |
| | | | 428/216 |
| 2015/0064453 A1* | 3/2015 | Imamura | C23C 16/36 |
| | | | 428/698 |

FOREIGN PATENT DOCUMENTS

| | | |
|---|---|---|
| EP | 3088108 A1 | 11/2016 |
| JP | 01-222044 A | 9/1989 |
| JP | 04-236765 A | 8/1992 |
| JP | 08-001412 A | 1/1996 |
| JP | 2000-158205 A | 6/2000 |
| JP | 2001-322008 A | 11/2001 |
| JP | 2005-153099 A | 6/2005 |
| JP | 2012-030309 A | 2/2012 |
| WO | 2012/133461 A1 | 10/2012 |
| WO | 2013/157472 A1 | 10/2013 |
| WO | 15/099047 A1 | 7/2015 |

OTHER PUBLICATIONS

Supplementary European Search Report dated Mar. 3, 2020, issued for the European Patent Application No. 17839400.3.
Office Action dated Dec. 24, 2019, issued for Chinese Patent Application No. 201780048720.7 and a partial English translation of Search Report.

* cited by examiner

[FIG. 1]
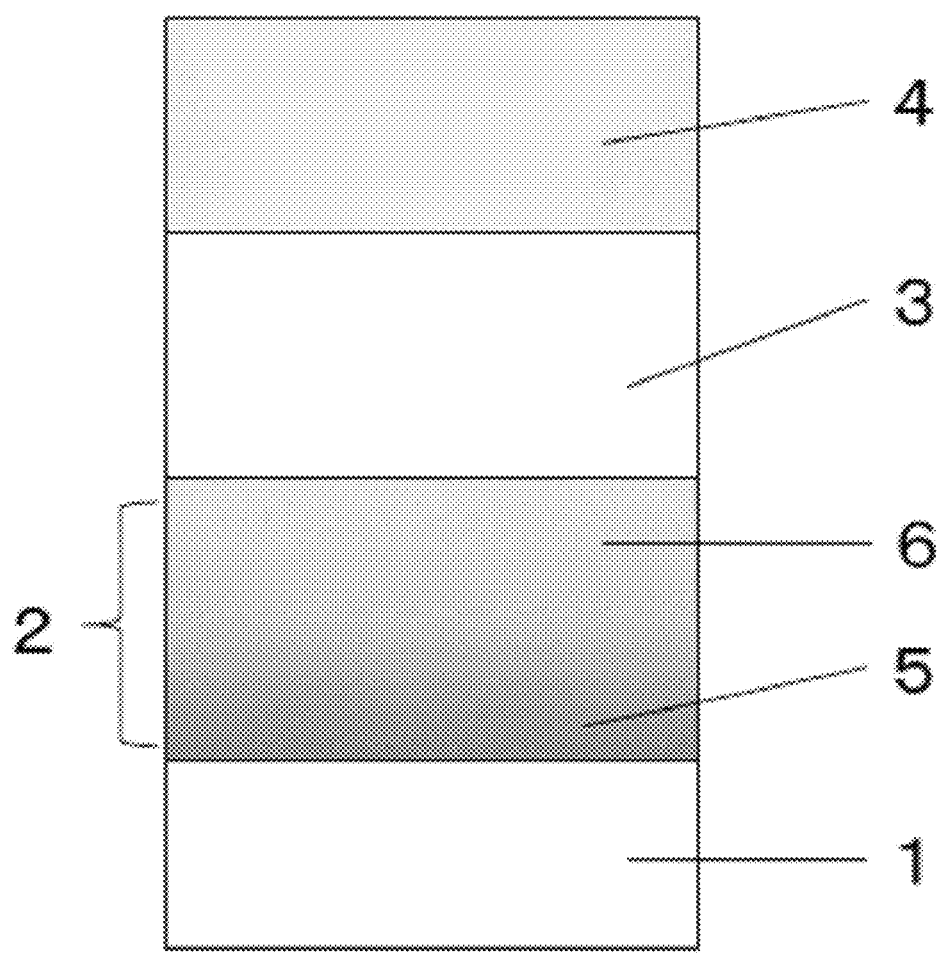

[FIG. 2]
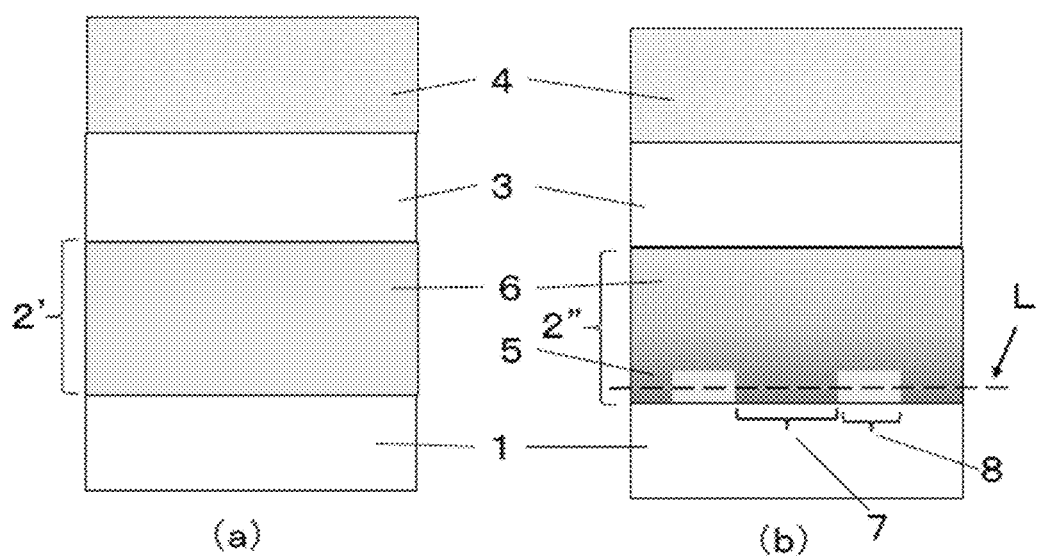

SURFACE-COATED CUTTING TOOL WITH EXCELLENT ADHESION-INDUCED CHIPPING RESISTANCE AND PEEL RESISTANCE

TECHNICAL FIELD

The present invention relates to a surface-coated cutting tool (hereinafter, referred to as a coated tool) provided with a hard coating layer having excellent adhesion-induced chipping resistance and excellent peeling resistance during intermittent cutting work on a difficult-to-cut material.

BACKGROUND ART

In the related art, in general, a coated tool is known in which, on the surface of a substrate (hereinafter, collectively referred to as a cutting tool substrate) made of tungsten carbide (hereinafter, referred to as WC)-based cemented carbide or titanium carbonitride (hereinafter, referred to as TiCN)-based cermet, a hard coating layer constituted by (a) and (b) is formed:

(a) A lower layer is a Ti compound layer formed of one layer or two or more layers of a Ti carbide (hereinafter, referred to as TiC) layer, a Ti nitride (hereinafter, referred to also as TiN) layer, a Ti carbonitride (hereinafter, referred to as TiCN) layer, a Ti oxycarbide (hereinafter, referred to as TiCO) layer, and a Ti oxycarbonitride (hereinafter, referred to as TiCNO) layer, all of which are formed by chemical vapor deposition; and (b) An upper layer is an aluminum oxide (hereinafter, referred to as $Al_2O_3$) layer formed by chemical vapor deposition. The coated tool is used for cutting work of various kinds of steel and cast iron.

However, such a coated tool has problems that chipping caused by welding and peeling tend to occur during cutting work on a difficult-to-cut material such as stainless steel, particularly duplex stainless steel, for example, during intermittent cutting work during which high intermittent and impact loads are exerted on a cutting edge, and thus the tool life thereof is short.

Several proposals have been made to prevent welding chipping, peeling, and the like by improving the adhesion between the cutting tool substrate and the hard coating layer.

For example, PTL 1 proposes a coated tool in which a cutting tool substrate containing C (for example, WC-based cemented carbide, cermet (primarily containing TiC, TiCN, or the like), high-speed steel, ceramics (titanium carbide, silicon carbide, or the like), or a diamond sintered substrate) is used, a layer in contact with the cutting tool substrate is a TiN layer, C is present in a state having a concentration distribution in a thickness direction of the TiN layer to reconcile conflicting actions, in which C as a component of the cutting tool substrate is diffused into the TiN layer, thus enhancing the adhesion between the cutting tool substrate and the coating film and making the coating film embrittled due to the presence of C in the TiN layer, the C concentration on the cutting tool substrate side is increased, and the concentration thereof is decreased toward the surface of the coating film.

In addition, according to the coated tool, it is considered that the improvement of the adhesion between the cutting tool substrate and the coating film formed on the surface thereof is achieved, and the embrittlement of the coating film is prevented.

In addition, PTL 2 proposes a coated tool in which the amount of oxygen measured by Auger spectrometry is set to 10 at % or less at an interface between a cutting tool substrate and a hard coating layer for the purpose of improving the adhesion and peeling resistance between the cutting tool substrate and the hard coating layer, and fine uneven portions having a surface roughness of 50 to 150 nm at the interface in terms of arithmetic mean roughness Ra value are formed. According to this coated tool, it is considered that since no oxide is present at the interface between the cutting tool substrate and the hard coating layer and the uneven portions of the interface have a predetermined arithmetic mean roughness Ra, the adhesion between the cutting tool substrate and the hard coating layer is good and chipping, fracturing, and film peeling do not occur.

CITATION LIST

Patent Literature

[PTL 1] International Publication No. WO2013/157472
[PTL 2] JP-A-2012-30309

SUMMARY OF INVENTION

Technical Problem

In recent years, there has been a strong demand for power saving and energy saving during cutting work. In accordance with this, coated tools are being used under more severe conditions, and for example, due to repetitions of adhesion and separation of a work material during cutting work, peeling frequently occurs at the interface between a cutting edge of a cutting tool substrate and a hard coating layer.

For example, in high-feed intermittent cutting of a material with a slit, which is a severe cutting work condition, a thermal cycle is applied to the cutting edge. Since the thermal expansion coefficient differs between the cutting tool substrate and the hard coating layer, due to thermal stress, coating peeling occurs more easily than in typical cases.

In addition, due to plastic deformation of the cutting tool substrate, peeling over a large area sometimes occurs at a place about 0.5 mm away from the cutting edge of a flank face. In addition, since this peeling over a large area frequently reaches the vicinity of the cutting edge and removes the hard coating layer of the cutting edge, the tool life largely varies.

As described above, in the high-feed intermittent cutting of the material with a slit, compared to typical cutting conditions, there are problems that the tool life tends to decrease, and the service life largely varies.

In both the coated tools proposed in PTLs 1 and 2, the occurrence of peeling or the like from the interface is prevented by increasing the adhesion between the cutting tool substrate and the hard coating layer. However, in a case where the work material is particularly a material with a slit of duplex stainless steel, which is a difficult-to-cut material that is liable to cause adhesion-induced chipping, peeling occurs in the vicinity of the cutting edge or peeling occurs at a position away from the cutting edge, so that the tool life is short during the high-feed intermittent cutting work.

Therefore, there is a demand for a coated tool which is excellent in adhesion-induced chipping resistance and peeling resistance even in cutting work on a difficult-to-cut material.

An object of the present invention is to provide a coated tool which prevents peeling due to thermal stress during cutting work and is less susceptible to peeling in the vicinity of a cutting edge or even at a position away from the cutting edge by improving the adhesion strength at the interface between a cutting tool substrate and a hard coating layer.

Solution to Problem

From the above-mentioned viewpoint, the inventors intensively studied a coated tool in which a hard coating layer has excellent adhesion-induced chipping resistance and peeling resistance even in the vicinity of a cutting edge and at a position away from the cutting edge even in a case where the coated tool is used for high-feed intermittent cutting work on a difficult-to-cut material such as duplex stainless steel during which high intermittent and impact loads are exerted on the cutting edge by improving the adhesion strength between a cutting tool substrate and the hard coating layer, and excellent cutting performance is exhibited for a long-term usage.

In particular, the inventors studied the relationship between the structure of the hard coating layer and the adhesion in the vicinity of the cutting edge of the coated tool and at a position of a flank face away from the cutting edge, and found that in a case where a Ti compound layer containing at least nitrogen and carbon is formed in the vicinity of a cutting edge and a flank face, a region where the nitrogen concentration gradually increases in the vicinity of the cutting edge from the interface between the cutting tool substrate and the hard coating layer toward the surface of the hard coating layer is formed, and furthermore, the average nitrogen concentration in the Ti compound layer in the vicinity of the cutting edge is set to be lower than the average nitrogen concentration in the Ti compound layer at the position of the flank face away from the cutting edge, in the vicinity of the cutting edge, the improvement of the adhesion between the cutting tool substrate and the hard coating layer is achieved and thus the occurrence of peeling in the vicinity of the cutting edge due to thermal stress during cutting work is prevented, and at the position of the flank face away from the vicinity of the cutting edge, the Ti compound layer having an enhanced ability to follow deformation of the cutting tool substrate is formed and thus the occurrence of peeling caused by the deformation of the cutting tool substrate can be suppressed.

Furthermore, it was found that in a case where regions having different nitrogen concentrations (a low nitrogen region and a high nitrogen region) are formed in the Ti compound layer at the position of the flank face away from the vicinity of the cutting edge in a direction parallel to the surface of the cutting tool substrate, the adhesion between the cutting tool substrate (flank face) and the Ti compound layer at the position of the flank face away from the vicinity of the cutting edge is further improved.

Therefore, it was found that in the coated tool in which the hard coating layer having the above-described structure is formed, even in high-feed intermittent cutting work on a difficult-to-cut material such as duplex stainless steel, the occurrence of adhesion-induced chipping and peeling is suppressed in the vicinity of the cutting edge and at the position away from the cutting edge, so that excellent cutting performance is exhibited for a long-term usage and an increase in tool life is achieved.

The present invention is made based on the above-described knowledge and is characterized by including "(1) A surface-coated cutting tool in which a hard coating layer is provided on a surface of a cutting tool substrate made of WC-based cemented carbide or TiCN-based cermet, in which (a) a Ti compound layer containing at least nitrogen and carbon is formed on the surface of the cutting tool substrate, (b) in a vicinity of a cutting edge of the cutting tool substrate, in a case where a nitrogen concentration in the Ti compound layer is measured in a direction perpendicular to the surface of the cutting tool substrate, within a range of 0.20 µm from the surface of the cutting tool substrate toward the Ti compound layer, the nitrogen concentration in the Ti compound layer gradually increases as a distance from the cutting tool substrate increases, and an average concentration gradient of the nitrogen concentration is 20 at %/µm or more and 300 at %/µm or less, and (c) an average nitrogen concentration in the Ti compound layer formed on the top of the surface of the cutting tool substrate in the vicinity of the cutting edge is lower than an average nitrogen concentration in the Ti compound layer formed on the top of the surface of the cutting tool substrate at a position of a flank face away from the cutting edge by 3 at % or more.

(2) The surface-coated cutting tool according to (1), in which, in the Ti compound layer formed on the top of the surface of the cutting tool substrate at the position of the flank face away from the cutting edge, in a case where a nitrogen concentration and a carbon concentration are measured along a direction parallel to the surface of the cutting tool substrate, a low nitrogen region having a high carbon concentration and a low nitrogen concentration (including zero nitrogen concentration) and a high nitrogen region having a high nitrogen concentration and a low carbon concentration (including zero carbon concentration) are present.

(3) The surface-coated cutting tool according to (1) or (2), in which one or more Ti compound layers are further formed on the surface of the Ti compound layer containing at least nitrogen and carbon and formed on the top of the surface of the cutting tool substrate.

(4) The surface-coated cutting tool according to (3), in which an $Al_2O_3$ layer having an α-form or κ-form crystal structure is further formed on a surface of the one or more Ti compound layers."

In addition, "the vicinity of the cutting edge" mentioned in the present invention means a honing portion in a case of a cutting tool having honing, and means a region within a distance of 0.02 mm or less from the cutting edge in a case of a cutting tool without honing.

In addition, "the position of the flank face away from the cutting edge" means a position 0.4 mm to 0.6 mm away from "the vicinity of the cutting edge" toward the flank face side.

The present invention will be described in detail below with reference to the drawings.

FIG. 1 illustrates an example of a schematic longitudinal sectional view of a hard coating layer formed on the surface of a cutting tool substrate in the vicinity of a cutting edge of a coated tool of the present invention.

FIGS. 2(a) and 2(b) illustrate examples of the schematic longitudinal sectional view of the hard coating layer formed on the surface of the cutting tool substrate at a position of a flank face of the coated tool of the present invention away from the cutting edge, in which (a) represents an aspect, and (b) represents another aspect.

According to the coated tool of the present invention illustrated in FIG. 1, on the top of the surface of a cutting tool substrate 1 made of WC-based cemented carbide or TiCN-based cermet in the vicinity of a cutting edge, as a first Ti compound layer 2, a Ti compound layer containing at least nitrogen and carbon (for example, a TiCN layer) in which the nitrogen concentration gradually increases from the cutting tool substrate side toward the surface of a hard coating layer is formed, as a second Ti compound layer 3, one or more Ti compound layers (for example, a TiCN layer having a uniform nitrogen concentration and a carbon concentration), are formed thereon, and an $Al_2O_3$ layer 4 is further formed thereon.

The first Ti compound layer 2 is, for example, a layer in which the nitrogen concentration contained in the layer gradually increases from the surface side of the cutting tool substrate toward the surface of the hard coating layer along the layer thickness direction, and in other words, can be a Ti compound layer in which a TiC or TiCN region 5 having a high carbon concentration is formed on the top of the surface of the cutting tool substrate in the vicinity of the cutting edge and a TiN or TiCN region 6 having a high nitrogen concentration is formed thereon.

On the other hand, the second Ti compound layer 3 is, for example, a Ti compound layer formed of a TiCN layer having a substantially uniform component concentration in the layer, and does not require a change in nitrogen concentration along the layer thickness direction.

Therefore, even if the first Ti compound layer 2 and the second Ti compound layer 3 are layers having the same component system as the TiCN system, it can be said that the first Ti compound layer 2 and the second Ti compound layer 3 are Ti compound layers having different layer structures in terms of the presence or absence of a change in component concentration along the layer thickness direction.

FIG. 2(*a*) illustrates a schematic longitudinal sectional view of an aspect of the hard coating layer formed on the surface of the cutting tool substrate at the position of the flank face away from the cutting edge.

According to the coated tool of the present invention illustrated in FIG. 2(*a*), at the position of the flank face away from the cutting edge, on the top of the surface of the cutting tool substrate 1 made of WC-based cemented carbide or TiCN-based cermet, as a first Ti compound layer 2', a Ti compound layer containing at least nitrogen is formed, as the second Ti compound layer 3, for example, a TiCN layer which is different from the first Ti compound layer 2' in nitrogen concentration, concentration distribution, and the like is formed thereon, and the $Al_2O_3$ layer 4 and an outermost layer are further formed thereon. The first Ti compound layer 2' is the Ti compound layer containing at least nitrogen, and like the first Ti compound layer 2, can be formed as, for example, a TiCN layer in which the nitrogen concentration gradually increases from the cutting tool substrate side toward the surface side of the hard coating layer. However, in the first Ti compound layer 2', the nitrogen concentration in the layer may not necessarily need to be changed in the layer thickness direction, and the first Ti compound layer 2' may be formed as a Ti compound layer having a substantially uniform component concentration across the layer.

The second Ti compound layer 3, the $Al_2O_3$ layer 4, and the outermost layer, which are formed on the surface of the first Ti compound layer 2', are the same as in the case of FIG. 1.

First Ti Compound Layer 2 Containing at Least Nitrogen and Carbon and Formed On the top of Surface of Cutting Tool Substrate in Vicinity of Cutting Edge:

As shown in FIG. 1, the first Ti compound layer 2 formed on the top of the surface of the cutting tool substrate 1 in the vicinity of the cutting edge is the Ti compound layer containing at least nitrogen and carbon, for example, a TiCN layer or TiCNO layer, and is preferably a TiCN layer.

In the first Ti compound layer 2, in a case where the nitrogen concentration is measured in a direction perpendicular to the surface of the cutting tool substrate 1 over a range of 0.2 μm toward the inside of the first Ti compound layer 2, the nitrogen concentration gradually increases as the distance from the surface of the cutting tool substrate 1 increases, and as a result, a low nitrogen region 5 having a high carbon concentration and a low nitrogen concentration (including zero nitrogen concentration) and a high nitrogen region 6 having a high nitrogen concentration and a low carbon concentration (including zero carbon concentration) are formed in the first Ti compound layer 2.

In addition, the presence of the low nitrogen region 5 and the high nitrogen region 6 in the first Ti compound layer 2 improves the adhesion between the cutting tool substrate 1 in the vicinity of the cutting edge and the first Ti compound layer 2 and prevents the occurrence of peeling of the first Ti compound layer 2 in the vicinity of the cutting edge due to thermal stress during cutting, and as a result, the adhesion-induced chipping resistance and peeling resistance are improved.

The reason why the adhesion and peeling resistance are improved by the first Ti compound layer 2 having the above structure is as follows.

First, as the conditions required for the first Ti compound layer 2 in order to improve the adhesion, the following (a) to (c) are adopted.

(a) Toughness of First Ti Compound Layer 2 as Whole:

It is known that at the time of cutting, the cutting tool substrate 1 made of, for example, WC-based cemented carbide is deformed due to cutting heat and loads applied to an edge tip by cutting. However, as the toughness of the first Ti compound layer 2 as a whole increases, the first Ti compound layer 2 is less likely to fracture even if the cutting tool substrate 1 is deformed, and the hard coating layer can follow the deformation of the cutting tool substrate 1.

On the contrary, in a case where the toughness of the first Ti compound layer 2 as a whole is low, when the cutting tool substrate 1 is deformed, cracks and the like are generated in the first Ti compound layer 2. When the cutting tool substrate 1 is further deformed in this state, the first Ti compound layer 2 fractures from the inside and becomes separated from the cutting tool substrate 1 (although this phenomenon is not strictly "peeling" but "fracture of the first Ti compound layer 2", the first Ti compound layer 2 is observed as if peeling occurs therein because the first Ti compound layer 2 is thinner than the other layers).

Between TiC and TiN, TiN is superior in toughness. Therefore, in order to achieve deformation following the deformation of the cutting tool substrate 1 during cutting work, it can be said that it is preferable for the first Ti compound layer 2 as a whole to have a large nitrogen amount.

(b) Toughness of First Ti Compound Layer 2 Formed on the Top of Surface of Cutting Tool Substrate 1

As described above, as the toughness of the first Ti compound layer 2 as a whole increases, the first Ti compound layer 2 itself is less likely to fracture when the cutting tool substrate 1 is deformed, and the hard coating layer can follow the deformation.

In addition to this, in a case where the toughness of the first Ti compound layer 2 formed on the top of the surface of the cutting tool substrate 1 is high, even when the cutting tool substrate 1 is deformed to a greater extent, the hard coating layer (the first Ti compound layer 2) can follow the deformation of the cutting tool substrate 1.

That is, in a case where the toughness of the first Ti compound layer 2 formed on the top of the surface of the cutting tool substrate 1 is low while the toughness of the first Ti compound layer 2 as a whole is high, when the cutting tool substrate 1 is deformed, cracking occurs at the interface between the cutting tool substrate 1 and the first Ti compound layer 2 and peeling occurs from the interface while cracking does not occur inside the first Ti compound layer 2.

In addition, between TiC and TiN, TiN is superior in toughness as described above. It can be said that in order to withstand deformation of the cutting tool substrate 1, it is preferable for the first Ti compound layer 2 on the top of the surface of the cutting tool substrate 1 to have a large nitrogen amount.

However, the inventors experimentally confirmed that "peeling from the cutting tool substrate is less likely to occur when "a Ti compound having a high nitrogen concentration and a Ti compound having a low nitrogen concentration coexist with each other on the top of the surface of the substrate" compared to when "a Ti compound layer having a uniform nitrogen concentration is formed on the top of the surface of the substrate"".

That is, it was confirmed that compared to when a Ti compound layer having a uniform composition of $TiC_{0.5}N_{0.5}$ is formed on the surface of the cutting tool substrate 1, when $TiC_{0.3}N_{0.7}$ is formed in the layer on the surface side corresponding to 50% of the layer thickness and $TiC_{0.7}N_{0.3}$ is formed in the layer on the cutting tool substrate side corresponding to the remaining 50% of the layer thickness in the layer thickness direction, peeling from the interface between the surface of the cutting tool substrate and the Ti compound layer is less likely to occur.

It is presumed that this is because even if a region covered with a Ti compound having a low nitrogen concentration and insufficient toughness cannot follow the deformation of the cutting tool substrate 1 and cracks occur at the interface, a region covered with a Ti compound having a high nitrogen concentration and sufficient toughness can stop propagation of the cracks, and the toughness (resistance to propagation of cracks) is improved on the surface.

(c) Difference in Coefficient of Thermal Expansion Between Cutting Tool Substrate 1 and First Ti Compound Layer 2 on the Top of Surface Thereof As the difference in coefficient of thermal expansion between the cutting tool substrate 1 and the first Ti compound layer 2 formed on the top of the surface thereof decreases, the thermal stress applied to the interface due to a change in the temperature of the edge tip during intermittent cutting decreases, so that peeling is less likely to occur.

The coefficient of thermal expansion measured in a range between room temperature, 25° C. to 1,000° C. is about $6.0 \times 10^{-6}/°$ C. (strictly speaking, varies depending on the composition) for the WC-based cemented carbide, $7.7 \times 10^{-6}/°$ C. for TiC, and $9.2 \times 10^{-6}/°$ C. for TiN. Therefore, it can be said that in order to reduce the thermal stress applied to the interface due to a change in the temperature of the edge tip, it is preferable for the Ti compound layer formed on the top of the tool substrate made of WC-based cemented carbide to have a small nitrogen concentration.

In addition, since the coefficient of thermal expansion of TiCN-based cermet is about $8.0 \times 10^{-6}/°$ C. (strictly speaking, varies depending on the composition), it can be said that in order to withstand the change in the temperature of the edge tip, it is most preferable that the Ti compound layer formed on the surface of the tool substrate made of TiCN-based cermet is a TiCN layer (although varying with the composition of the TiCN-based cermet, $Ti_{50}C_{40}N_{10}$ of a nitrogen amount of about 10 at % and a carbon amount of about 40 at %) having a such nitrogen amount that the same coefficient of thermal expansion as that of the TiCN-based cermet is achieved.

The coated tool of the present invention (see FIG. 1) in which the first Ti compound layer 2 in which the nitrogen concentration gradually increases as the distance from the surface of the cutting tool substrate in the direction perpendicular thereto increases is formed on the top of the surface of the cutting tool substrate 1 in the vicinity of the cutting edge, has improved adhesion between the cutting tool substrate 1 and the first Ti compound layer 2 in the vicinity of the cutting edge and improved peeling resistance for the above reasons, in summary:

(1) The first Ti compound layer 2 as a whole having a high nitrogen concentration ensures toughness, and can follow the deformation of the tool substrate 1 made of WC-based cemented carbide.

(2) The first Ti compound layer 2 in contact with the surface of the cutting tool substrate 1 has a low nitrogen concentration (the low nitrogen region 5 is present) and thus has a small difference in thermal expansion from the cutting tool substrate 1, and there is a smooth change in the coefficient of thermal expansion inside the first Ti compound layer 2, so that the thermal stress generated at the interface due to the change in the temperature of the edge tip decreases.

In addition, it is preferable that the average layer thickness of the first Ti compound layer 2 is 0.2 to 2.0 μm. This is because, when the average layer thickness thereof is less than 0.2 μm, the effect of improving the adhesion to the cutting tool substrate 1 by gradually increasing the nitrogen concentration along the layer thickness direction is small, and when the average layer thickness exceeds 2.0 μm, it becomes difficult to secure the thickness of another layer having excellent wear resistance.

The adhesion and peeling resistance can be secured by forming the first Ti compound layer 2. However, since the high-temperature hardness and high-temperature strength are inferior to those of the second Ti compound layer 3, in a case where the total layer thickness of the hard coating layer including the second Ti compound layer and the like is increased in order to improve wear resistance and the like, on the contrary, peeling easily occurs. Therefore, it is preferable that the average layer thickness of the first Ti compound layer 2 is set to a "minimum necessary layer thickness for securing the adhesion".

In addition, as the nitrogen concentration gradually increases, it is necessary to form a region in which the average concentration gradient of the nitrogen concentration is 20 at %/μm or more and 300 at %/μm or less over a range of 0.2 μm from the surface of the cutting tool substrate 1 in the direction perpendicular thereto toward the inside of the first Ti compound layer 2.

This is because, when the average concentration gradient of the nitrogen concentration over a range of 0.2 μm toward the inside of the first Ti compound layer 2 is less than 20 at %/μm, the effect of gradually increasing the nitrogen concentration is small, and "the toughness of the first Ti compound layer 2 as a whole" and "reducing the difference of the first Ti compound layer 2 formed on the top of the surface of the cutting tool substrate 1 in thermal expansion" cannot be sufficiently compatible with each other.

In addition, this is because when the average concentration gradient of the nitrogen concentration exceeds 300 at %/μm, there is a sharp change in the coefficient of thermal expansion in the first Ti compound layer 2, and the durability against the change in the temperature of the edge tip decreases (due to a large change in the coefficient of thermal expansion, the thermal stress when the temperature changes increases, and peeling from the interface easily occurs).

Formation of the first Ti compound layer 2, that is, the first Ti compound layer 2 which is a Ti compound layer containing at least nitrogen and carbon and having a region in which the average concentration gradient of the nitrogen concentration is 20 at %/μm or more and 300 at %/μm or less over a range of 0.2 μm from the surface of the cutting tool substrate 1 in the direction perpendicular thereto toward the inside of the first Ti compound layer 2, is closely related to formation of the first Ti compound layer 2', which will be described later, and can be performed by, for example, the following method.

First, under typical conditions according to a chemical vapor deposition method, for example, under conditions of Reaction gas composition (vol %): 3.5% to 5.0% of $TiCl_4$, 15% to 35% of $N_2$, and $H_2$ as the remainder, Reaction atmosphere temperature: 880° C. to 920° C., and Reaction atmosphere pressure: 9 to 35 kPa, TiN is deposited in the vicinity of the cutting edge of the cutting tool substrate 1 and at a position of the flank face away from the cutting edge, then only TiN deposited in the vicinity of the cutting edge is removed with a brush or the like. Then, under conditions of Reaction gas composition (vol %): 1.0% of $TiCl_4$, 0.5% to 1.5% of $CH_3CN$, 8% to 25% of $N_2$, and $H_2$ as the remainder, Reaction atmosphere temperature: 880° C. to 920° C., and Reaction atmosphere pressure: 5 to 9 kPa, TiCN having a low nitrogen concentration is initially deposited.

Thereafter, the amount of $CH_3CN$ is gradually decreased and the concentration of the other gases and the reaction atmosphere pressure are gradually changed. Lastly, under deposition conditions of TiCN having a high nitrogen concentration, for example, under conditions of Reaction gas composition (vol %): 1.5% to 5.0% of $TiCl_4$, 0.1% of $CH_3CN$, 8% to 25% of $N_2$, and $H_2$ as the remainder, Reaction atmosphere temperature: 880° C. to 920° C., and Reaction atmosphere pressure: 5 to 9 kPa, TiCN having a high nitrogen concentration is deposited, whereby the first Ti compound layer 2 having a predetermined average concentration gradient of the nitrogen concentration in the direction perpendicular to the surface of the cutting tool substrate 1 can be formed.

In addition, instead of the deposition of the TiCN having a high nitrogen concentration, even when TiN is deposited under typical TiN deposition conditions, for example, under conditions of Reaction gas composition (vol %): 3.5% to 5.0% of $TiCl_4$, 15% to 35% of $N_2$, and $H_2$ as the remainder, Reaction atmosphere temperature: 880° C. to 920° C., and Reaction atmosphere pressure: 9 to 35 kPa, the first Ti compound layer 2 having a predetermined average concentration gradient of the nitrogen concentration in the direction perpendicular to the surface of the cutting tool substrate 1 can be formed.

Due to the deposition as described above, a Ti compound layer containing at least carbon (in the example, a TiCN layer having a low nitrogen concentration) is formed on the top of the surface of the cutting tool substrate 1 in the vicinity of the cutting edge in an initial stage of film formation, a TiCN layer or TiN layer having a high nitrogen concentration is subsequently formed, and the nitrogen concentration in the layer is gradually changed, whereby, as the first Ti compound layer 2, the first Ti compound layer 2 (in other words, a Ti compound layer in which TiC or a TiCN region 5 having a low nitrogen concentration and TiN or a TiCN region 6 having a high nitrogen concentration are present) having a region in which the nitrogen concentration gradually increases (the average concentration gradient of the nitrogen concentration is 20 at %/μm or more and 300 at %/μm or less) over a range of 0.2 μm from the surface of the cutting tool substrate 1 in the direction perpendicular thereto toward the inside of the first Ti compound layer 2 can be formed.

Film formation formed in a plurality of separate stages to gradually change the nitrogen concentration over a range of 0.2 μm from the surface of the tool substrate in terms of the nitrogen concentration in the first Ti compound layer 2 enables the first Ti compound layer 2 having excellent adhesion, durability against a change in the temperature of the edge tip, excellent adhesion-induced chipping resistance, and peeling resistance to be obtained.

By forming the first Ti compound layer 2 under the above-described conditions, the adhesion between the cutting tool substrate 1 and the first Ti compound layer 2 in the vicinity of the cutting edge is improved, and the durability against a change in the temperature of the edge tip is provided. Therefore, during intermittent cutting of a difficult-to-cut material such as duplex stainless steel, the occurrence of adhesion-induced chipping, peeling, and the like can be suppressed.

However, in order to maintain excellent wear resistance for a long-term usage, it is preferable to form, on the surface of the first Ti compound layer 2, as necessary, the second Ti compound layer 3 formed of one or more Ti compound layers, or further form the $Al_2O_3$ layer 4 formed of an α-$Al_2O_3$ layer or κ-$Al_2O_3$ layer.

Second Ti Compound Layer 3:

The second Ti compound layer 3 can be formed of one or more Ti compound layers, and specifically, formed of Ti any one or more selected from a TiC layer, a TiN layer, a TiCN layer, a TiCO layer, and a TiCNO layer, or a Ti compound layer which contains at least nitrogen and carbon and having a gradient composition in which the amount of nitrogen gradually changes as the distance from the cutting tool substrate increases.

A preferable second Ti compound layer 3 is a TiCN layer from the viewpoint of excellent high-temperature hardness and high-temperature structure. However, any Ti compound layer increases the high-temperature hardness and high-temperature strength of the hard coating layer as a whole. At the same time, the adhesion to the first Ti compound layer 2 is excellent, and in a case where the $Al_2O_3$ layer 4 formed of an α-$Al_2O_3$ layer or κ-$Al_2O_3$ layer is formed on the surface of the second Ti compound layer 3, the adhesion to the $Al_2O_3$ layer 4 is also excellent.

It is preferable that the average total layer thickness of the first Ti compound layer 2 and the second Ti compound layer 3 is 2 to 25 μm. This is because when the average total layer thickness is less than 2 μm, the high-temperature hardness and high-temperature strength cannot be sufficiently secured, and the effect of increasing the service life by improving wear resistance is small. On the other hand, when the average total layer thickness exceeds 25 μm, chipping, peeling, and the like occurs during intermittent cutting work.

$Al_2O_3$ Layer 4 and Outermost Layer:

In a case of forming the $Al_2O_3$ layer 4 having an α-form or κ-form crystal structure on the second Ti compound layer 3, as is well known, the improvement of the high-temperature hardness and heat resistance is achieved.

However, when the average layer thickness of the $Al_2O_3$ layer 4 having an α-form or κ-form crystal structure is less than 0.5 μm, the effect of increasing the service life by improving wear resistance is small. On the other hand, when the average layer thickness exceeds 20 μm, $Al_2O_3$ crystal grains tend to be coarsened, and as a result, in addition to a reduction in the high-temperature hardness and high-temperature strength, chipping, peeling, and the like occur during intermittent cutting work. Therefore, in a case of forming the $Al_2O_3$ layer 4 having an α-form or κ-form crystal structure on the second Ti compound layer 3, the average layer thickness thereof is preferably 0.5 to 20 μm.

In order to improve a property of identifying the edge tip, TiN or the like may be formed on the $Al_2O_3$ layer 4, and furthermore, the $Al_2O_3$ layer 4 may be subjected to a treatment such as shot peeling after forming the hard coating layer.

FIG. 2(a) illustrates a schematic longitudinal sectional view of an aspect of the hard coating layer formed on the surface of the cutting tool substrate at the position of the flank face away from the cutting edge.

According to FIG. 2(a), in the coated tool of the present invention, at the position of the flank face away from the cutting edge, on the top of the surface of the cutting tool substrate 1 made of WC-based cemented carbide or TiCN-based cermet, the first Ti compound layer 2' containing at least nitrogen is formed, the second Ti compound layer 3 (for example, TiCN layer) formed of one or more layers is formed thereon, and the $Al_2O_3$ layer 4 and the outermost layer are further formed thereon.

The first Ti compound layer 2' formed on the top of the surface of the cutting tool substrate 1 at the position of the flank face away from the cutting edge is formed of TiN or a TiCN layer having a high nitrogen concentration, which has excellent toughness so as not to generate large-scale peeling due to the deformation of the cutting tool substrate 1 during cutting work and is able to deform following the deformation of the cutting tool substrate 1.

For this, there is a need to specify the relationship between the average nitrogen concentration in the first Ti compound layer 2 (see FIG. 1) formed on the top of the surface of the cutting tool substrate 1 in the vicinity of the cutting edge and the average nitrogen concentration in the first Ti compound layer 2' formed on the top of the surface of the cutting tool substrate 1 at the position of the flank face away from the cutting edge, and specifically, the average nitrogen concentration in the first Ti compound layer 2 (see FIG. 1) formed on the top of the surface of the cutting tool substrate 1 in the vicinity of the cutting edge needs to be balanced to be lower than the average nitrogen concentration in the first Ti compound layer 2' formed on the top of the surface of the cutting tool substrate 1 at the position of the flank face away from the cutting edge by 3 at % or more.

Accordingly, the occurrence of peeling of the first Ti compound layer 2 in the vicinity of the cutting edge due to the deformation of the cutting tool substrate 1 and thermal stress is prevented, and at the same time, the occurrence of peeling of the first Ti compound layer 2' at the position of the flank face away from the cutting edge, which is caused by the deformation of the cutting tool substrate 1, can be prevented.

The second Ti compound layer 3, the $Al_2O_3$ layer 4, and the outermost layer further formed on the first Ti compound layer 2' formed at the position of the flank face away from the cutting edge are the same as the case of the above-mentioned second Ti compound layer 3, the $Al_2O_3$ layer 4, and the outermost layer formed in the vicinity of the cutting edge.

As described above, by forming the first Ti compound layer 2 on the surface of the cutting tool substrate in the vicinity of the cutting edge, and further forming the second Ti compound layer 3, the $Al_2O_3$ layer 4, and the outermost layer thereon (see FIG. 1), the occurrence of peeling due to the deformation of the cutting tool substrate and thermal stress is prevented, and by forming the first Ti compound layer 2' on the surface of the cutting tool substrate at the position of the flank face away from the cutting edge, and further forming the second Ti compound layer 3, the $Al_2O_3$ layer 4, and the outermost layer thereon (see FIG. 2(a)), the occurrence of large-scale peeling at the position of the flank face away from the cutting edge due to the deformation of the cutting tool substrate is prevented, whereby the coated tool of the present invention exhibits excellent wear resistance for a long-term usage without the occurrence of adhesion-induced chipping and occurrence of peeling.

Next, another aspect of the hard coating layer formed at the position of the flank face of the coated tool of the present invention away from the cutting edge will be described using FIG. 2(b).

According to the coated tool of the present invention of FIG. 2(b), at the position of the flank face away from the cutting edge, on the top of the surface of the cutting tool substrate 1 made of WC-based cemented carbide or TiCN-based cermet, a first Ti compound layer 2" containing at least nitrogen and carbon is formed, the second Ti compound layer 3 formed of one or more layers is formed thereon, and the $Al_2O_3$ layer 4 is further formed thereon.

The first Ti compound layer 2" formed on the top of the surface of the cutting tool substrate 1 at the position of the flank face away from the cutting edge is a layer which has excellent toughness so as not to generate large-scale peeling due to the deformation of the cutting tool substrate during cutting work, is able to deform following the deformation of the cutting tool substrate 1, improves the durability against a change in the temperature of the edge tip by reducing the difference in thermal expansion from the cutting tool substrate 1, and thus further improves adhesion-induced chipping resistance and peeling resistance.

As illustrated in FIG. 2(b), at the position of the flank face away from the cutting edge, in a case where the nitrogen concentration and carbon concentration in the first Ti compound layer 2" formed on the top of the surface of the cutting tool substrate 1 are measured along a direction L parallel to the surface of the cutting tool substrate at a position at a distance of 0.04 μm from the surface of the cutting tool substrate, a low nitrogen region 7 having a high carbon concentration and a low nitrogen concentration (including zero nitrogen concentration) and a high nitrogen region 8 having a high nitrogen concentration and a low carbon concentration (including zero carbon concentration) are formed.

Furthermore, the first Ti compound layer 2" in which, in a case where the nitrogen concentration in the first Ti compound layer 2" is measured in a direction perpendicular to the surface of the cutting tool substrate 1 in the low nitrogen region 7, like the first Ti compound layer 2 described above, the nitrogen concentration in the first Ti compound layer 2" gradually increases within a range of 0.2 μm from the surface of the cutting tool substrate 1 toward the first Ti compound layer 2" side as the distance from the cutting tool substrate 1 increases, and the average concentration gradient of the nitrogen concentration is 20 at %/μm or more and 300 at %/μm or less.

The operational effect of the concentration gradient of nitrogen formed in the direction perpendicular to the surface of the cutting tool substrate 1 in the first Ti compound layer 2" is similar to that in the first Ti compound layer 2 described above.

In addition, the low nitrogen region 7 having a high carbon concentration and a low nitrogen concentration (including zero nitrogen concentration), which is formed along the direction L parallel to the surface of the cutting tool substrate 1, prevents the occurrence of peeling in the flank face caused by thermal stress due to a change in the temperature of the cutting tool substrate 1, and since the high nitrogen region 8 having a high nitrogen concentration and a low carbon concentration (including zero carbon concentration) is formed, the occurrence of peeling caused by the deformation of the cutting tool substrate 1 is prevented while securing the toughness of the first Ti compound layer 2".

Therefore, since the low nitrogen region 7 and the high nitrogen region 8 coexist with each other in the first Ti compound layer 2" along the direction L parallel to the surface of the cutting tool substrate 1, the adhesion-induced chipping resistance and peeling resistance are further improved. In addition, the difference in nitrogen concentration between the "low nitrogen region 7" and the "high nitrogen region 8" is preferably 3 at % or more, and more preferably 8 at % or more.

In addition, the average nitrogen concentration in the first Ti compound layer 2 (see FIG. 1) formed on the top of the surface of the cutting tool substrate 1 in the vicinity of the cutting edge needs to be balanced to be lower than the average nitrogen concentration in the first Ti compound layer 2" formed on the top of the surface of the cutting tool substrate 1 at the position of the flank face away from the cutting edge by 3 at % or more.

Accordingly, the occurrence of peeling caused by the deformation of the cutting tool substrate 1 and thermal stress is prevented not only in the first Ti compound layer 2 in the vicinity of the cutting edge but also in the first Ti compound layer 2" at the position of the flank face away from the cutting edge.

The second Ti compound layer 3, the $Al_2O_3$ layer 4, and the outermost layer may be further formed on the first Ti compound layer 2" formed at the position of the flank face away from the cutting edge, and these actions are the same as the case of forming the second Ti compound layer 3, the $Al_2O_3$ layer 4, and the outermost layer described above.

Film Forming Method:

In the coated tool of the present invention, the first Ti compound layer 2 formed on the top of the surface of the cutting tool substrate 1 in the vicinity of the cutting edge and the first Ti compound layer 2' (see FIGS. 1 and 2(a)) formed on the top of the surface of the cutting tool substrate 1 at the position of the flank face away from the cutting edge are Ti compound layers having different layer structures, but can be formed, for example, by the following method.

(a) First, by a typical CVD apparatus, a TiN layer is deposited on the surface of the cutting tool substrate 1 including at least the vicinity of the cutting edge and the position of the flank face away from the cutting edge.

(b) Next, the TiN layer formed to cover the vicinity of the cutting edge of the cutting tool substrate 1 is removed by any means such as a brush.

(c) Next, in the CVD apparatus, TiCN is deposited on the surface of the cutting tool substrate 1 including the vicinity of the cutting edge where the TiN layer is not present and the position of the flank face away from the cutting edge where the TiN layer is formed, and deposition is continued by adjusting deposition conditions (gas composition) to gradually increase the N concentration until a predetermined layer thickness is reached.

(d) Next, as necessary, the second Ti compound layer 3, and the $Al_2O_3$ layer 4 or a TiN layer as the outermost layer are deposited in the CVD apparatus.

According to the film forming method, the coated tool of the present invention including the first Ti compound layer 2 in the vicinity of the cutting edge, which is illustrated in FIG. 1, and the first Ti compound layer 2' (or furthermore, the second Ti compound layer 3, the $Al_2O_3$ layer 4, and the outermost layer) at the position of the flank face away from the cutting edge, which is illustrated in FIG. 2(a), can be produced.

In addition, film formation can also be performed by the following method.

(a) First, by a typical CVD apparatus, TiCN is deposited on the surface of the cutting tool substrate 1 including at least the vicinity of the cutting edge and the position of the flank face away from the cutting edge, and deposition conditions (gas composition) are adjusted to gradually increase the N concentration.

(b) Next, the TiCN layer formed to cover the position of the flank face of the cutting tool substrate 1 away from the cutting edge with a gradually increasing N concentration is removed by any means such as a brush.

(c) Next, in the CVD apparatus, TiN is deposited on the surface of the cutting tool substrate 1 including the vicinity of the cutting edge where the TiCN layer with a gradually increasing N concentration is present and the position of the flank face away from the cutting edge where the TiCN layer with a gradually increasing N concentration is not present, and deposition is continued until a predetermined layer thickness is reached.

(d) Next, as necessary, the second Ti compound layer 3, and the $Al_2O_3$ layer 4 or a TiN layer as the outermost layer are deposited in the CVD apparatus.

According to the film forming method, the coated tool of the present invention including the first Ti compound layer 2 in the vicinity of the cutting edge, which is illustrated in FIG. 1, and the first Ti compound layer 2' (or furthermore, the second Ti compound layer 3, the $Al_2O_3$ layer 4, and the outermost layer) at the position of the flank face away from the cutting edge, which is illustrated in FIG. 2(a), can be produced.

In addition, the coated tool (see FIGS. 1 and 2(b)) including the first Ti compound layer 2 on the top of the surface of the cutting tool substrate 1 in the vicinity of the cutting edge and the first Ti compound layer 2" on the top of the surface of the cutting tool substrate 1 at the position of the flank face away from the cutting edge can be formed, for example, by the following method.

(a) First, by a typical CVD apparatus, a small amount of TiCN having a high nitrogen concentration is deposited on the surface of the cutting tool substrate 1 including at least the vicinity of the cutting edge and the position of the flank face away from the cutting edge (in addition, here, the small amount of TiCN deposited with a high nitrogen concentration finally becomes the high nitrogen region 8 formed in the first Ti compound layer 2").

(b) Next, the small amount of TiCN deposited in the vicinity of the cutting edge of the cutting tool substrate 1 is removed by any means such as a brush.

(c) Next, in the CVD apparatus, a TiCN layer having a low nitrogen concentration is deposited on the surface of the cutting tool substrate 1 including the vicinity of the cutting edge, from which the TiCN is removed, and the position of the flank face away from the cutting edge where the small amount of TiCN having a high nitrogen concentration is deposited, and a TiCN layer (a TiN layer is also possible) having a high nitrogen concentration is finally deposited by adjusting deposition conditions (gas composition) to gradually increase the N concentration until a predetermined layer thickness is reached.

(d) Next, as necessary, the second Ti compound layer 3, and the $Al_2O_3$ layer 4 or a TiN layer as the outermost layer are deposited in the CVD apparatus.

According to the film forming method, the coated tool of the present invention including the first Ti compound layer 2 in the vicinity of the cutting edge, which is illustrated in FIG. 1, and the first Ti compound layer 2'' (or furthermore, the second Ti compound layer 3, the $Al_2O_3$ layer 4, and the outermost layer) at the position of the flank face away from the cutting edge, which is illustrated in FIG. 2(*b*), can be produced.

Advantageous Effects of Invention

In the coated tool of the present invention, by forming, on the top of the surface of the cutting tool substrate 1 in the vicinity of the cutting edge, as the first Ti compound layer 2, the first Ti compound layer 2 which contains at least nitrogen and carbon and has an nitrogen concentration gradually increasing over a range of 0.2 μm from the surface of the cutting tool substrate 1 in a direction perpendicular thereto toward the inside of the first Ti compound layer 2 in the layer, the occurrence of peeling due to thermal stress and occurrence of peeling caused by the deformation of the cutting tool substrate 1 can be prevented.

In addition, since the first Ti compound layer 2' is formed on the top of the surface of the cutting tool substrate 1 at the position of the flank face away from the cutting edge, the occurrence of peeling caused by the deformation of the cutting tool substrate can be prevented, and in a case where the first Ti compound layer 2'' is formed, the occurrence of peeling due to thermal stress and occurrence of peeling caused by the deformation of the cutting tool substrate can be prevented.

Therefore, in the coated tool of the present invention, by forming, as the hard coating layer, at least the first Ti compound layer 2 on the top of the surface of the cutting tool substrate 1 in the vicinity of the cutting edge, and forming the first Ti compound layer 2' or the first Ti compound layer 2'' on the top of the surface of the cutting tool substrate 1 at the position of the flank face away from the cutting edge, the occurrence of adhesion-induced chipping and occurrence of peeling are suppressed during intermittent cutting work on a difficult-to-cut material such as duplex stainless steel during which high intermittent and impact loads are exerted, excellent wear resistance can be exhibited for a long-term usage, and an increase in the service life of the coated tool is achieved.

BRIEF DESCRIPTION OF DRAWINGS

FIG. 1 illustrates an example of a schematic longitudinal sectional view of a hard coating layer formed on the surface of a cutting tool substrate 1 in the vicinity of a cutting edge of a coated tool of the present invention.

FIG. 2 is an example of a schematic longitudinal sectional view of the hard coating layer formed on the surface of the cutting tool substrate 1 at a position of a flank face of the coated tool of the present invention away from the cutting edge, where (a) illustrates an aspect, and (b) illustrates another aspect.

DESCRIPTION OF EMBODIMENTS

Next, the coated tool of the present invention will be described in detail with reference to examples.

Example 1

As raw material powders, a WC powder, a TiC powder, a ZrC powder, a TaC powder, a NbC powder, a $Cr_3C_2$ powder, a TiN powder, and a Co powder, all of which had an average particle size of 1 to 3 μm, were prepared, and the raw material powders were mixed in mixing compositions shown in Table 1. Wax was further added thereto, and the mixture was blended in acetone by a ball mill for 24 hours and was decompressed and dried. Thereafter, the resultant was press-formed into compacts having predetermined shapes at a pressure of 98 MPa, and the compacts were sintered in a vacuum at 5 Pa under the condition that the compacts were held at a predetermined temperature in a range of 1370° C. to 1470° C. for one hour. After the sintering, cutting tool bodies A and B made of WC-based cemented carbide with insert shapes specified in ISO CNMG120408 were produced by performing honing with R: 0.04 mm on the cutting edge portion.

In addition, as raw material powders, a TiCN (TiC/TiN=50/50 in terms of mass ratio) powder, a NbC powder, a TaC powder, a WC powder, a ZrC powder, a $Mo_2C$ powder, a Co powder, and a Ni powder, all of which had an average particle size of 0.5 to 2 μm, were prepared, and the raw material powders were mixed in mixing compositions shown in Table 2, were subjected to wet mixing by a ball mill for 24 hours, and were dried. Thereafter, the resultant was press-formed into a compact at a pressure of MPa, and the compact was sintered in a nitrogen atmosphere at 1.3 kPa under the condition that the compact was held at a temperature of 1540° C. for one hour. After the sintering, a cutting tool substrate C made of TiCN-based cermet with an insert shape according to ISO standard CNMG120408 was produced by performing honing with R: 0.04 mm on the cutting edge portion.

Next, using a typical chemical vapor deposition apparatus, the first Ti compound layer 2 illustrated in FIG. 1 and the first Ti compound layer 2' illustrated in FIG. 2(*a*) were deposited on the surfaces of the cutting tool bodies A to C under the conditions indicated as forming symbols A to D in Table 3.

For example, forming conditions by forming symbol A are more specifically described as follows. (a) First, a TiN layer was deposited on the surface of the cutting tool substrate 1 including the vicinity of the cutting edge and the position of the flank face away from the cutting edge under conditions A shown in Table 3.

(b) Next, only the TiN layer formed to cover the vicinity of the cutting edge of the cutting tool substrate 1 was removed with a brush.

(c) Next, on the surface of the cutting tool substrate 1 including the vicinity of the cutting edge, from which the TiN layer was removed with the brush, and the position of the flank face away from the cutting edge, a TiCN layer having a low nitrogen concentration was deposited under conditions A shown in Table 3, and deposition was continued under the same conditions A shown in Table 3 while gradually changing gas conditions and the pressure of the reaction atmosphere to forming conditions of TiCN having a high nitrogen concentration, whereby the first Ti compound layer 2 shown in Table 6 was formed in the vicinity of the cutting edge, and similarly, the first Ti compound layer 2' shown in Table 6 was formed at the position of the flank face away from the cutting edge.

(d) Next, for some of the cutting tool bodies, on the surfaces of the first Ti compound layer 2 and the first Ti compound layer 2', the second Ti compound layer 3, and the $Al_2O_3$ layer 4 or a TiN layer as the outermost layer for cutting edge identification, shown in Table 5 were deposited under the conditions shown in Table 4.

By the film formation described above, present invention coated tools 1 to 14, in which the first Ti compound layer 2 shown in Table 6 was formed on the top of the surface of the cutting tool substrate 1 in the vicinity of the cutting edge and the first Ti compound layer 2' shown in Table 6 was formed on the top of the surface of the cutting tool substrate 1 at the position of the flank face away from the cutting edge, were produced.

In addition, by the film formation described above, as shown in Table 6, the first Ti compound layer 2 in which the nitrogen concentration was gradually increased over a range of 0.2 μm from the surface of the cutting tool substrate 1 in the vicinity of the cutting edge in a direction perpendicular thereto toward the inside of the first Ti compound layer 2 and the average concentration gradient of the nitrogen concentration was 20 at %/μm or more and 300 at %/μm or less was formed, and furthermore, the first Ti compound layer 2 in which the average nitrogen concentration in the first Ti compound layer 2 was lower than the average nitrogen concentration of the first Ti compound layer 2' by 3 at % or more was formed.

In addition, for the purpose of comparison, under the conditions indicated as forming symbols G and H in Table 3, the first Ti compound layer 2 and the first Ti compound layer 2' were deposited on the surfaces of the cutting tool bodies A to C, and furthermore, similarly, under the conditions shown in Table 4, the second Ti compound layer 3, and the $Al_2O_3$ layer 4 having an α-form or κ-form crystal structure shown in Table 5, and furthermore, for some of the cutting tool bodies, the TiN layer as the outermost layer for cutting edge identification, were formed, whereby comparative example coated tools 1 to 14 shown in Table 7 were produced.

In the vicinity of the interface between the surfaces of the cutting tool bodies 1 of the present invention coated tool 1 to 14 and the comparative example coated tool 1 to 14, the first Ti compound layer 2, and the first Ti compound layer 2', the nitrogen concentration (at %) at various positions in the first Ti compound layer 2 in the vicinity of the cutting edge and in the first Ti compound layer 2' at the position of the flank face away from the cutting edge were measured by Auger electron spectroscopy.

More specifically, first, in the vicinity of the cutting edge, angular lapping was performed on a surface inclined by 15° with respect to the thickness direction, and CP polishing was performed.

Next, line analysis was performed in a region in the vicinity of the interface sandwiching the interface between the surface of the cutting tool substrate 1 and the first Ti compound layer 2, and each of the nitrogen concentration at a position corresponding to 0.04 μm toward the inside of the first Ti compound layer 2 from the interface between the surface of the cutting tool substrate 1 and the first Ti compound layer 2 (This position is referred to as "position A". The position A is a "position of 0.04 μm from the interface between the surface of the cutting tool substrate 1 and the first Ti compound layer 2 toward the inside of the first Ti compound layer 2 in a case where polishing was performed on a surface parallel to the thickness direction". Therefore, in a case of analysis by lapping of the surface inclined by 15° with respect to the thickness direction, owing to 0.04/sin(15°)=0.15, a position of 0.15 μm from the interface between the surface of the cutting tool substrate 1 and the first Ti compound layer 2 toward the inside of the first Ti compound layer 2 is the position A.), the nitrogen concentration at a position corresponding to 0.12 μm from the interface toward the inside of the first Ti compound layer 2 (referred to as "position B"), and the nitrogen concentration at a position corresponding to 0.20 μm from the interface toward the inside of the first Ti compound layer 2 (referred to as "position C") was measured.

In addition, the line analysis described above was performed on five different regions in the vicinity of the interface, the nitrogen concentrations measured at each position were averaged, and this value was obtained as the "nitrogen concentration (at %)" at each position of the first Ti compound layer 2.

The nitrogen concentrations (at %) at various positions in the first Ti compound layer 2' at the position of the flank face away from the cutting edge were measured in the same method as described above, the nitrogen concentrations measured at each position of the flank face away from the cutting edge were averaged, and this value was obtained as the "nitrogen concentration (at %)" at each position of the first Ti compound layer 2'.

It is presumed that there may be a case where the amount of nitrogen at the position A is not 50 at % as in "the position of the flank face away from the cutting edge" of the present invention example coated tool 1 although TiN is formed because carbon was slightly diffused from the tool substrate.

Furthermore, from the "nitrogen concentrations (at %)" of the first Ti compound layer 2 and the first Ti compound layer 2' obtained as described above, the average concentration gradient of the nitrogen concentration between the position A and the position B of the first Ti compound layer 2 and the first Ti compound layer 2' was calculated as average concentration gradient BA (at %/μm)=(nitrogen concentration at position B−nitrogen concentration at position A)/(0.12−0.04), and the average concentration gradient of the nitrogen concentration between the position B and the position C was calculated as average concentration gradient CB (at %/μm) =(nitrogen concentration at position C−nitrogen concentration at position B)/(0.20−0.12).

Table 6 shows the "nitrogen concentration (at %)", the average concentration gradient BA (at %/μm), and the average concentration gradient CB (at %/μm) obtained as above.

Here, "both the average concentration gradient BA (at %/μm) and the average concentration gradient CB (at %/μm) are 20 at %/μm or more and 300 at %/μm or less" means that "in a case where the nitrogen concentration from the surface of the cutting tool substrate 1 in the direction perpendicular thereto in the vicinity of the cutting edge is measured, within a range of 0.20 μm from the surface of the cutting tool substrate 1 toward the first Ti compound layer 2 side, the nitrogen concentration in the first Ti compound layer 2 gradually increases as the distance from the cutting tool substrate 1 increases, and the average concentration gradient of the nitrogen concentration is 20 at %/μm or more and 300 at %/μm or less".

As for a method of forming the first Ti compound layer 2 and the first Ti compound layer 2', in addition to a method of gradually changing the gas concentration and the film forming atmosphere pressure, gas conditions may be changed in stages.

Even in this case, when the condition that "both the average concentration gradient BA (at %/μm) and the average concentration gradient CB (at %/μm) are 20 at %/μm or more and 300 at %/μm or less" is satisfied, the first Ti compound layer 2 and the first Ti compound layer 2' excellent in adhesion and peeling resistance can be obtained.

In addition, in the first Ti compound layer 2 in the vicinity of the cutting edge and the first Ti compound layer 2' at the position of the flank face away from the cutting edge, the average nitrogen concentration of the entire layer was obtained by the following method, and the difference between the average nitrogen concentration of the first Ti compound layer 2 and the average nitrogen concentration of the first Ti compound layer 2' at the position of the flank face away from the cutting edge was calculated.

That is, the measurement method and definition of the average nitrogen concentration of the layer mentioned in the present invention are as follows.

Through a line scan of Auger electron spectroscopy, by performing a line scan vertically on the cutting tool substrate and TiCN interface with a line width of 10 μm, each of the nitrogen concentration (Ca) at a position (position A) corresponding to 0.04 μm from the interface between the surface of the cutting tool substrate 1 and the first Ti compound layer 2 toward the inside of the first Ti compound layer 2, the nitrogen concentration (Cb) at a position (referred to as "position B") corresponding to 0.12 μm toward the inside of the first Ti compound layer 2, and the nitrogen concentration (Cc) at a position (referred to as "position C") corresponding to 0.20 μm from the interface toward the inside of the first Ti compound layer 2 is measured, and the average value (Ca+Cb+Cc)/3 of the nitrogen concentrations at the three positions A, B, and C is obtained.

This line scan is performed on five different cutting tool bodies and TiCN interfaces, and the average value of (Ca+Cb+Cc)/3 of the five interfaces is defined as the "average nitrogen concentration of the layer".

Table 6 and Table 7 show these values.

The layer thickness of each constituent layer of the present invention coated tools 1 to 14 and the comparative example coated tools 1 to 14 produced as described above was measured using a scanning electron microscope, and the average layer thickness thereof was obtained.

Table 5 to Table 7 show these values.

TABLE 1

| Kind | Mixing composition (mass %) | | | | | | | |
|---|---|---|---|---|---|---|---|---|
| | Co | TiC | ZrC | TaC | NbC | $Cr_3C_2$ | TiN | WC |
| Cutting tool substrate A | 8 | 0.5 | — | — | — | 0.5 | 0.5 | Remainder |
| Cutting tool substrate B | 10 | — | 0.5 | 0.5 | 0.5 | — | 0.5 | Remainder |

TABLE 2

| Kind | Mixing composition (mass %) | | | | | | | |
|---|---|---|---|---|---|---|---|---|
| | NbC | TaC | WC | ZrC | $Mo_2C$ | Co | Ni | TiCN |
| Cutting tool substrate C | 0.5 | 0.5 | 10 | 0.5 | 2 | 12 | 3 | Remainder |

TABLE 3

| First Ti compound layer | | Forming conditions (pressure of reaction atmosphere cs expressed as kPa and temperature is expressed as ° C.) | | | |
|---|---|---|---|---|---|
| Forming symbol | Forming method | | Reaction gas composition (vol %) | Reaction atmosphere | |
| | | | | Pressure | Temperature |
| A | After forming TiN, remove only TiN in the vicinity of a cutting edge with a brush, form low-nitrogen TiCN, and subsequently perform film formation by gradually changing gas conditions and the pressure of a reaction atmosphere to high-nitrogen TiCN forming conditions, thereby forming a first Ti compound layer 2 and a first Ti compound layer 2'. | TiN | $TiCl_4$: 4.2%, $N_2$: 20%, $H_2$: remainder | 10 | 900 |
| | | Low-nitrogen TiCN | $TiCl_4$: 4.2%, $CH_3CN$: 1.0%, $N_2$: 20%, $H_2$: remainder | 6 | 900 |
| | | High-nitrogen TiCN | $TiCl_4$: 4.2%, $CH_3CN$: 0.1%, $N_2$: 20%, $H_2$: remainder | 9 | 900 |
| | | High-nitrogen TiCN | $TiCl_4$: 4.2%, $CH_3CN$: 0.1%, $N_2$: 20%, $H_2$: remainder | 6 | 900 |
| B | After forming high-nitrogen TiCN, remove only the high-nitrogen TiCN in vicinity of a cutting edge with a brush, form low-nitrogen TiCN, and subsequently perform film formation by changing gas conditions and the pressure of a reaction atmosphere to TiN forming conditions in three stages, thereby forming a first Ti compound layer 2 and a first Ti compound layer 2'. | Low-nitrogen TiCN (first stage) | $TiCl_4$: 4.2%, $CH_3CN$: 1.0%, $CH_4$: 1.0%, $H_2$: remainder | 6 | 900 |
| | | TiCN (second stage) | $TiCl_4$: 4.2%, $CH_3CN$: 0.6%, $N_2$: 20%, $H_2$: remainder | 8 | 900 |
| | | TiN (third stage) | $TiCl_4$: 4.2%, $N_2$: 20%, $H_2$: remainder | 10 | 900 |
| C | Form TiCN, and subsequently perform film formation by gradually changing gas conditions and the pressure of a reaction atmosphere to TiN forming conditions. Next, after removing, with a brush, TiCN in which the N concentration in a flank face excluding the vicinity of a cutting edge was gradually changed, form TiN, thereby forming a first Ti compound layer. | TiCN | $TiCl_4$: 4.2%, $CH_3CN$: 1.0%, $N_2$: 20%, $H_2$: remainder | 6 | 900 |
| | | TiN | $TiCl_4$: 4.2%, $N_2$: 20%, $H_2$: remainder | 10 | 900 |
| D | Form TiN, remove only TiN in the vicinity of a cutting edge with a brush, form TiC, and subsequently perform film formation by changing | TiN | $TiCl_4$: 4.2%, $N_2$: 20%, $H_2$: remainder | 10 | 900 |
| | | TiC (first stage) | $TiCl_4$: 4.2%, $CH_4$: 8.5%, $H_2$: remainder | 7 | 1000 |

TABLE 3-continued

| First Ti compound layer | Forming conditions (pressure of reaction atmosphere cs expressed as kPa and temperature is expressed as ° C.) | | | | |
|---|---|---|---|---|---|
| Forming symbol | Forming method | | Reaction gas composition (vol %) | Reaction atmosphere Pressure | Temperature |
| | gas conditions and the pressure of a reaction atmosphere to TiN forming conditions in three stages, thereby forming a first Ti compound layer. | TiCN (second stage) | TiCl$_4$: 4.2%, CH$_3$CN: 1.0%, N$_2$: 20%, H$_2$: remainder | 6 | 900 |
| | | TiN (third stage) | TiCl$_4$: 4.2%, N$_2$: 20%, H$_2$: remainder | 10 | 900 |
| E | Form only TiN as a first Ti compound layer. | TiN | TiCl$_4$: 4.2%, N$_2$: 20%, H$_2$: remainder | 10 | 900 |
| F | Form only TiC as a first Ti compound layer. | TiC | TiCl$_4$: 4.2%, CH$_4$: 8.5%, H$_2$: remainder | 7 | 1000 |
| G | Form low-nitrogen TiCN, and subsequently perform film formation by gradually changing gas conditions and the pressure of a reaction atmosphere to high-nitrogen TiCN forming conditions, thereby forming a first Ti compound layer. | Low-nitrogen TiCN | TiCl$_4$: 4.2%, CH$_3$CN: 1.0%, N$_2$: 20%, H$_2$: remainder | 6 | 900 |
| | | High-nitrogen TiCN | TiCl$_4$: 4.2%, CH$_3$CN: 0.1%, N$_2$: 20%, H$_2$: remainder | 9 | 900 |
| H | Form TiN, remove only TiN in the vicinity of a cutting edge with a brush, form low-nitrogen TiCN, and subsequently perform film formation by gradually changing gas conditions and the pressure of a reaction atmosphere to high-nitrogen TiCN forming conditions, thereby forming a first Ti compound layer. | TiN | TiCl$_4$: 4.2%, N$_2$: 20%, H$_2$: remainder | 10 | 900 |
| | | Low-nitrogen TiCN | TiCl$_4$: 4.2%, CH$_3$CN: 1.0%, N$_2$: 20%, H$_2$: remainder | 6 | 900 |
| | | High-nitrogen TiCN | TiCl$_4$: 4.2%, CH$_3$CN: 0.9%, N$_2$: 20%, H$_2$: remainder | 7 | 900 |

TABLE 4

| | | Forming conditions (pressure of reaction atmosphere is expressed as kPa and temperature is expressed as ° C.) | | |
|---|---|---|---|---|
| | Kind | Reaction gas composition (vol %) | Reaction atmosphere Pressure | Temperature |
| Second Ti compound layer | TiC | TiCl$_4$: 4.2%, CH$_4$: 8.5%, H$_2$: remainder | 7 | 1000 |
| | l-TiCN | TiCl$_4$: 2%, CH$_3$CN: 0.7%, N$_2$: 10%, H$_2$: remainder | 7 | 900 |
| | TiCN | TiCl$_4$: 2%, CH$_4$: 1%, N$_2$: 15%, H$_2$: remainder | 13 | 1000 |
| | TiN | TiCl$_4$: 4.2%, N$_2$: 35%, H$_2$: remainder | 50 | 1040 |
| | TiCNO | TiCl$_4$: 2%, CO: 1%, CH$_4$: 1%, N$_2$: 5%, H$_2$: remainder | 13 | 1000 |
| Al$_2$O$_3$ layer | α-Al$_2$O$_3$ | AlCl$_3$: 2.2%, CO$_2$: 6.5%, HCl: 2.2%, H$_2$S: 0.2%, H$_2$: remainder | 7 | 1000 |
| | κ-Al$_2$O$_3$ | AlCl$_3$: 3.0%, CO$_2$: 5.0%, H$_2$S: 0.3%, H$_2$: remainder | 7 | 970 |
| Outermost layer | TiN | TiCl$_4$: 4.2%, N$_2$: 35%, H$_2$: remainder | 50 | 1040 |

TABLE 5

| | | Cutting tool substrate symbol | Second Ti compound layer 3 | | Al$_2$O$_3$ layer 4 | | Outermost layer | |
|---|---|---|---|---|---|---|---|---|
| Kind | | | Kind | Average layer thickness (μm) | Kind | Average layer thickness (μm) | Kind | Average layer thickness (μm) |
| Present invention coated tool and comparative example coated tool | 1 | 15 | A | l-TiCN | 4 | TiCNO | 1 | α-Al$_2$O$_3$ | 3 | — |
| | 2 | 16 | A | l-TiCN | 4 | TiCNO | 1 | α-Al$_2$O$_3$ | 3 | — |
| | 3 | 17 | A | l-TiCN | 4 | TiCNO | 1 | α-Al$_2$O$_3$ | 3 | — |
| | 4 | 18 | A | l-TiCN | 4 | TiCNO | 1 | α-Al$_2$O$_3$ | 3 | — |
| | 5 | 19 | A | l-TiCN | 4 | TiCNO | 1 | α-Al$_2$O$_3$ | 3 | — |
| | 6 | 20 | A | TiCN | 8 | — | — | α-Al$_2$O$_3$ | 3 | 0.5 |
| | 7 | 21 | A | l-TiCN | 8 | TiCNO | 1 | κ-Al$_2$O$_3$ | 1 | 0.5 |
| | 8 | 22 | A | l-TiCN | 4 | TiCNO | 1 | α-Al$_2$O$_3$ | 3 | — |
| | 9 | 23 | B | l-TiCN | 4 | TiCNO | 1 | α-Al$_2$O$_3$ | 3 | — |
| | 10 | 24 | B | TiCN | 8 | — | — | α-Al$_2$O$_3$ | 3 | 0.5 |
| | 11 | 25 | C | l-TiCN | 4 | TiCNO | 1 | α-Al$_2$O$_3$ | 3 | — |

TABLE 5-continued

| | Cutting tool substrate symbol | Second Ti compound layer 3 | | | | Al₂O₃ layer 4 | | Outermost layer |
|---|---|---|---|---|---|---|---|---|
| Kind | | Kind | Average layer thickness (μm) | Kind | Average layer thickness (μm) | Kind | Average layer thickness (μm) | Average layer thickness (μm) |
| 12 | 26 | C | l-TiCN | 4 | TiCNO | 1 | α-Al₂O₃ | 3 | — |
| 13 | 27 | A | l-TiCN | 6 | TiC | 1 | — | — | — |
| 14 | 28 | A | TiC | 4 | TiN | 1 | — | — | — |

TABLE 6

First Ti compound layer 2, first Ti compound layer 2'

First Ti compound layer 2 in vicinity of cutting edge
Component concentration in direction perpendicular to surface of cutting tool substrate

| Kind | | Cutting tool substrate symbol | Forming symbol | Nitrogen concentration (at %) | | | Average concentration gradient BA (at %/μm) | Average concentration gradient CB (at %/μm) | Average nitrogen concentration (at %) |
|---|---|---|---|---|---|---|---|---|---|
| | | | | Position A | Position B | Position C | | | |
| Present invention coated tool | 1 | A | A | 28 | 34 | 39 | 75 | 63 | 34 |
| | 2 | A | B | 21 | 32 | 43 | 138 | 138 | 32 |
| | 3 | A | C | 26 | 34 | 42 | 100 | 100 | 34 |
| | 4 | A | C | 26 | 29 | 31 | 38 | 25 | 29 |
| | 5 | A | C | 24 | 36 | 48 | 150 | 150 | 36 |
| | 6 | A | C | 26 | 34 | 42 | 100 | 100 | 34 |
| | 7 | A | C | 26 | 34 | 42 | 100 | 100 | 34 |
| | 8 | A | D | 1 | 22 | 44 | 263 | 275 | 22 |
| | 9 | B | A | 27 | 34 | 39 | 88 | 63 | 33 |
| | 10 | B | C | 25 | 33 | 42 | 100 | 113 | 33 |
| | 11 | C | A | 28 | 34 | 39 | 75 | 63 | 34 |
| | 12 | C | C | 26 | 34 | 42 | 100 | 100 | 34 |
| | 13 | A | C | 26 | 34 | 42 | 100 | 100 | 34 |
| | 14 | A | C | 26 | 34 | 42 | 100 | 100 | 34 |

First Ti compound layer 2, first Ti compound layer 2'

| Kind | | Cutting tool substrate symbol | First Ti compound layer 2 in vicinity of cutting edge Average layer thickness (μm) | First Ti compound layer 2' at position of flank face away from cutting edge | | | | | Difference in average nitrogen concentration between first Ti compound layer 2 and first Ti compound layer 2' (at %) |
|---|---|---|---|---|---|---|---|---|---|
| | | | | Direction perpendicular to surface of cutting tool substrate | | | | | |
| | | | | Nitrogen concentration (at %) | | | Average nitrogen concentration (at %) | Average layer thickness (μm) | |
| | | | | Position A | Position B | Position C | | | |
| Present invention coated tool | 1 | A | 0.3 | 49 | 50 | 28 | 42 | 0.45 | 8 |
| | 2 | A | 0.3 | 38 | 38 | 37 | 38 | 0.5 | 6 |
| | 3 | A | 0.6 | 49 | 50 | 50 | 50 | 0.3 | 16 |
| | 4 | A | 1.3 | 49 | 50 | 50 | 50 | 0.3 | 21 |
| | 5 | A | 0.48 | 49 | 50 | 50 | 50 | 0.25 | 14 |
| | 6 | A | 0.6 | 49 | 50 | 50 | 50 | 0.3 | 16 |
| | 7 | A | 0.6 | 49 | 50 | 50 | 50 | 0.3 | 16 |
| | 8 | A | 0.3 | 49 | 50 | 5 | 35 | 0.45 | 13 |
| | 9 | B | 0.3 | 47 | 49 | 27 | 41 | 0.45 | 8 |
| | 10 | B | 0.6 | 48 | 49 | 50 | 49 | 0.3 | 16 |
| | 11 | C | 0.3 | 50 | 50 | 28 | 43 | 0.45 | 9 |
| | 12 | C | 0.6 | 50 | 50 | 50 | 50 | 0.3 | 16 |
| | 13 | A | 0.6 | 50 | 50 | 50 | 50 | 0.3 | 16 |
| | 14 | A | 0.6 | 50 | 50 | 50 | 50 | 0.3 | 16 |

TABLE 7

| Kind | | Cutting tool substrate symbol | Forming symbol | First Ti compound layer 2 Direction perpendicular to surface of cutting tool substrate in vicinity of cutting edge | | | | | |
|---|---|---|---|---|---|---|---|---|---|
| | | | | Nitrogen concentration (at %) | | | Average concentration gradient BA (at %/μm) | Average concentration gradient CB (at %/μm) | Average nitrogen concentration (at %) |
| | | | | Position A | Position B | Position C | | | |
| Comparative example coated tool | 1 | A | D | 0 | 24 | 49 | 300 | 313 | 24 |
| | 2 | A | E | 49 | 50 | 50 | 13 | 0 | 50 |
| | 3 | A | F | 0 | 0 | 0 | 0 | 0 | 0 |
| | 4 | A | G | 28 | 34 | 39 | 75 | 63 | 34 |
| | 5 | A | H | 25 | 26 | 27 | 13 | 13 | 26 |
| | 6 | A | G | 28 | 34 | 39 | 75 | 63 | 34 |
| | 7 | A | G | 28 | 34 | 39 | 75 | 63 | 34 |
| | 8 | A | B | 21 | 32 | 43 | 150 | 138 | 32 |
| | 9 | B | D | 0 | 24 | 49 | 300 | 313 | 24 |
| | 10 | B | G | 28 | 34 | 39 | 75 | 63 | 34 |
| | 11 | C | D | 0 | 24 | 49 | 300 | 313 | 24 |
| | 12 | C | G | 28 | 34 | 39 | 75 | 63 | 34 |
| | 13 | A | G | 28 | 34 | 39 | 75 | 63 | 34 |
| | 14 | A | G | 28 | 34 | 39 | 75 | 63 | 34 |

| Kind | | First Ti compound layer 2 Average layer thickness (μm) | First Ti compound layer 2' Direction perpendicular to surface of cutting tool substrate at position of flank face away from cutting edge | | | | Average layer thickness (μm) | Difference in average nitrogen concentration between first Ti compound layer 2 and first Ti compound layer 2' (at %) |
|---|---|---|---|---|---|---|---|---|
| | | | Nitrogen concentration (at %) | | | Average nitrogen concentration (at %) | | |
| | | | Position A | Position B | Position C | | | |
| Comparative example coated tool | 1 | 0.23 | 49 | 50 | 3 | 34 | 0.37 | 10 |
| | 2 | 0.3 | 49 | 50 | 50 | 50 | 0.45 | 0 |
| | 3 | 0.3 | 0 | 0 | 0 | 0 | 0.45 | 0 |
| | 4 | 0.3 | 29 | 34 | 39 | 34 | 0.3 | 0 |
| | 5 | 0.5 | 49 | 50 | 25 | 41 | 0.65 | 15 |
| | 6 | 0.3 | 29 | 34 | 39 | 34 | 0.3 | 0 |
| | 7 | 0.3 | 29 | 34 | 39 | 34 | 0.3 | 0 |
| | 8 | 0.3 | 38 | 38 | 26 | 34 | 0.4 | 2 |
| | 9 | 0.23 | 49 | 50 | 3 | 34 | 0.37 | 10 |
| | 10 | 0.29 | 29 | 34 | 39 | 34 | 0.29 | 0 |
| | 11 | 0.23 | 49 | 50 | 3 | 34 | 0.37 | 10 |
| | 12 | 0.29 | 30 | 34 | 39 | 34 | 0.29 | 0 |
| | 13 | 0.3 | 29 | 34 | 39 | 34 | 0.3 | 0 |
| | 14 | 0.3 | 29 | 34 | 39 | 34 | 0.3 | 0 |

Next, in a state in which each of the present invention coated tools 1 to 14 and the comparative example coated tools 1 to 14 was screwed to a tip end portion of an insert holder made of tool steel by a fixing tool, under conditions including Work material: a round bar with one longitudinal groove formed in the longitudinal direction of JIS SUS329,
Cutting speed: 130 m/min,
Depth of cut: 2.0 mm,
Feed: 0.40 mm/rev,
Cutting time: 1.0 minute, and
Cutting oil: water-soluble coolant, a wet intermittent cutting work test of duplex stainless steel was conducted, and the flank face wear width (mm) was measured and visually observed to check the damage state in the vicinity of the cutting edge and the damage state at the position of the flank face away from the cutting edge.

Table 8 shows the results.

TABLE 8

| Kind | | Flank face wear width (mm) | Visual observation results | Kind | | Flank face wear width (mm) | Visual observation results |
|---|---|---|---|---|---|---|---|
| Present invention coated tool | 1 | 0.14 | Peeling and adhesion-induced chipping absent | Comparative example coated tool | 1 | 0.55 | Adhesion-induced chipping present |

TABLE 8-continued

| Kind | Flank face wear width (mm) | Visual observation results | Kind | Flank face wear width (mm) | Visual observation results |
| --- | --- | --- | --- | --- | --- |
| 2 | 0.16 | Peeling and adhesion-induced chipping absent | 2 | 0.39 | Peeling present |
| 3 | 0.13 | Peeling and adhesion-induced chipping absent | 3 | 0.42 | Small peeling present |
| 4 | 0.13 | Peeling and adhesion-induced chipping absent | 4 | 0.35 | Peeling present |
| 5 | 0.15 | Peeling and adhesion-induced chipping absent | 5 | 0.41 | Peeling and adhesion-induced chipping absent |
| 6 | 0.17 | Peeling and adhesion-induced chipping absent | 6 | 0.43 | Peeling present |
| 7 | 0.14 | Peeling and adhesion-induced chipping absent | 7 | — | Fractured after processing for 50 seconds |
| 8 | 0.16 | Peeling and adhesion-induced chipping absent | 8 | — | Fractured after processing for 55 seconds |
| 9 | 0.13 | Peeling and adhesion-induced chipping absent | 9 | 0.46 | Adhesion-induced chipping present |
| 10 | 0.13 | Peeling and adhesion-induced chipping absent | 10 | 0.5 | Peeling present |
| 11 | 0.15 | Peeling and adhesion-induced chipping absent | 11 | 0.42 | Small peeling present |
| 12 | 0.14 | Peeling and adhesion-induced chipping absent | 12 | — | Fractured after processing for 40 seconds |
| 13 | 0.28 | Peeling and adhesion-induced chipping absent | 13 | — | Fractured after processing for 55 seconds |
| 14 | 0.27 | Peeling and adhesion-induced chipping absent | 14 | — | Fractured after processing for 40 seconds |

From the results shown in Table 8, in the present invention coated tools 1 to 14, the first Ti compound layer 2 containing at least nitrogen and carbon is formed to cover the vicinity of the cutting edge on the top of the surface of the cutting tool substrate, a nitrogen concentration distribution in which the nitrogen concentration gradually increases over a range of 0.2 μm from the surface of the cutting tool substrate in a direction perpendicular thereto toward the inside of the layer is formed, and the average nitrogen concentration in the first Ti compound layer 2 formed on the top of the surface of the cutting tool substrate in the vicinity of the cutting edge is lower than the average nitrogen concentration of the first Ti compound layer 2' formed on the top of the surface of the cutting tool substrate at the position of the flank face away from the cutting edge by 3 at % or more, whereby the occurrence of peeling due to thermal stress in the vicinity of the cutting edge and the occurrence of peeling caused by the deformation of the cutting tool substrate can be suppressed, and furthermore, the occurrence of peeling caused by the deformation of the cutting tool substrate at the position of the flank face away from the cutting edge can be suppressed.

Contrary to this, in the comparative example coated tools, it is obvious that since the first Ti compound layer 2 and the first Ti compound layer 2' having the layer structure specified in the present invention are not formed, the tool life is short due to the occurrence of peeling caused by thermal stress or deformation of the cutting tool substrate and the cutting performance is inferior to that of the present invention coated tools.

Example 2

Next, the first Ti compound layer 2 illustrated in FIG. 1 and the first Ti compound layer 2" illustrated in FIG. 2(*b*)

were deposited on the surfaces of the cutting tool bodies A to C using a typical chemical vapor deposition apparatus under the conditions indicated as forming symbols J to M in Table 9.

For example, forming conditions by forming symbol J are as follows.

(a) First, a small amount of TiCN having a high nitrogen concentration was deposited on the surface of the cutting tool substrate 1 including the vicinity of the cutting edge and the position of the flank face away from the cutting edge under conditions J shown in Table 9.

(b) Next, only the small amount of TiCN having a high nitrogen concentration, which was deposited in the vicinity of the cutting edge of the cutting tool substrate 1 was removed with a brush.

(c) Next, a TiCN layer having a low nitrogen concentration was deposited under conditions J shown in Table 9 on the surface of the cutting tool substrate 1 including the vicinity of the cutting edge, from which the TiCN having a high nitrogen concentration was removed with a brush, and the position of the flank face away from the cutting edge, and deposition was continued while adjusting gas conditions and the pressure of the reaction atmosphere to gradually increase the N concentration such that the TiCN layer (or TiN layer) having a high nitrogen concentration is finally deposited, the first Ti compound layer 2 shown in Table 10 was formed in the vicinity of the cutting edge, and the first Ti compound layer 2" shown in Table 10 was formed at the position of the flank face away from the cutting edge.

(d) Next, for some of the cutting tool bodies, on the surfaces of the first Ti compound layer 2 and the first Ti compound layer 2", the second Ti compound layer 3, and the $Al_2O_3$ layer 4 or a TiN layer as the outermost layer for cutting edge identification, shown in Table 5 were formed under the conditions shown in Table 4.

By the film formation described above, present invention coated tools 15 to 28 in which the first Ti compound layer 2 shown in Table 10 was formed on the top of the surface of the cutting tool substrate 1 in the vicinity of the cutting edge and the first Ti compound layer 2" shown in Table 10 was formed on the top of the surface of the cutting tool substrate 1 at the position of the flank face away from the cutting edge were produced.

In addition, by the film formation described above, as shown in Table 10, the first Ti compound layer 2 in which the nitrogen concentration was gradually increased over a range of 0.2 μm from the surface of the cutting tool substrate 1 in the vicinity of the cutting edge in a direction perpendicular thereto toward the inside of the first Ti compound layer 2 and the average concentration gradient of the nitrogen concentration was 20 at %/μm or more and 300 at %/μm or less was formed, and furthermore, the first Ti compound layer 2 in which the average nitrogen concentration in the first Ti compound layer 2 was lower than the average nitrogen concentration of the first Ti compound layer 2" by 3 at % or more was formed.

Furthermore, by the film formation described above, in the first Ti compound layer 2" formed on the top of the surface of the cutting tool substrate 1 at the position of the flank face away from the cutting edge, as shown in Table 10, a low nitrogen region and a high nitrogen region were formed in a direction parallel to the surface of the cutting tool substrate 1.

In the first Ti compound layer 2 formed on the top of the surface of the cutting tool substrate 1 in the vicinity of the cutting edge and the first Ti compound layer 2" formed on the top of the surface of the cutting tool substrate 1 at the position away from the cutting edge in the present invention coated tools 15 to 28, in the same manner as in Example 1, the nitrogen concentration (at %) from the surface of the cutting tool substrate 1 in the direction perpendicular thereto was measured by Auger electron spectroscopy, and was obtained as the "nitrogen concentration (at %)" at each position of the first Ti compound layer 2 or the first Ti compound layer 2".

In addition, in the first Ti compound layer 2, the average concentration gradient BA (at %/μm) and the average concentration gradient CB (at %/μm) were calculated.

Furthermore, in the first Ti compound layer 2 in the vicinity of the cutting edge and the first Ti compound layer 2" at the position of the flank face away from the cutting edge, the average nitrogen concentration of the entire layer was obtained, and the difference between the average nitrogen concentration of the first Ti compound layer 2 and the average nitrogen concentration of the first Ti compound layer 2" at the position of the flank face away from the cutting edge was calculated.

Table 10 shows the results.

By performing a line analysis on the first Ti compound layer 2" formed on the top of the surface of the cutting tool substrate 1 at the position away from the cutting edge in the present invention coated tools 15 to 28, at a distance of 0.04 μm from the surface of the cutting tool substrate 1 along the direction parallel to the surface of the cutting tool substrate 1, by Auger electron spectroscopy, the nitrogen concentration (at %) and the carbon concentration (at %) were measured.

Next, five low nitrogen regions were specified from the local minimum of the measured nitrogen concentration and the local maximum of the carbon concentration, and five high nitrogen regions were specified from the local maximum of the nitrogen concentration and the local minimum of the carbon concentration.

Next, the values measured in the low nitrogen region and the high nitrogen region were averaged, and these values were obtained as the nitrogen concentration (at %) and the carbon concentration (at %) in each region of the low nitrogen region and the high nitrogen region.

Table 10 shows the results.

The layer thickness of each constituent layer of the present invention coated tools 15 to 28 was measured using the scanning electron microscope, and the average layer thickness thereof was obtained.

Table 5 and Table 10 show these values.

TABLE 9

| First Ti compound layer Forming symbol | Forming method | Reaction gas composition (vol %) | | Reaction atmosphere Pressure | Temperature |
|---|---|---|---|---|---|
| J | After depositing a small amount of high-nitrogen TiCN, remove only the high-nitrogen TiCN in the vicinity of a cutting edge with a brush, form a low-nitrogen TiCN layer, and subsequently form a first Ti compound layer 2 and a first Ti compound layer 2" by gradually changing gas conditions and the pressure of a reaction atmosphere to high-nitrogen TiCN layer forming conditions. | High-nitrogen TiCN | TiCl$_4$: 4.2%, CH$_3$CN: 0.1%, N$_2$: 20%, H$_2$: remainder | 9 | 900 |
| | | Low-nitrogen TiCN | TiCl$_4$: 4.2%, CH$_3$CN: 1.0%, N$_2$: 10%, H$_2$: remainder | 6 | 900 |
| | | High-nitrogen TiCN | TiCl$_4$: 4.2%, CH$_3$CN: 0.1%, N$_2$: 20%, H$_2$: remainder | 9 | 900 |
| K | After depositing a small amount of TiN, remove only the TiN in the vicinity of a cutting edge with a brush, form a low-nitrogen TiCN, and subsequently form a first Ti compound layer 2 and a first Ti compound layer 2' by gradually changing gas conditions and the pressure of a reaction atmosphere to high-nitrogen TiCN forming conditions. | TiN (small amount) | TiCl$_4$: 4.2%, N$_2$: 20%, H$_2$: remainder | 10 | 900 |
| | | Low-nitrogen TiCN | TiCl$_4$: 4.2%, CH$_3$CN: 1.0%, N$_2$: 20%, H$_2$: remainder | 6 | 900 |
| | | High-nitrogen TiCN | TiCl$_4$: 4.2%, CH$_3$CN: 0.1%, N$_2$: 20%, H$_2$: remainder | 9 | 900 |
| L | After depositing a small amount of high-nitrogen TiCN, remove only the high-nitrogen TiCN in the vicinity of a cutting edge with a brush, form low-nitrogen TiCN, and subsequently form a first Ti compound layer 2 and a first Ti compound layer 2' by changing gas conditions and the pressure of a reaction atmosphere to TiN layer forming conditions in three stages. | High-nitrogen TiCN (small amount) | TiCl$_4$: 4.2%, CH$_3$CN: 0.1%, N$_2$: 20%, H$_2$: remainder | 6 | 900 |
| | | Low-nitrogen TiCN (first stage) | TiCl$_4$: 4.2%, CH$_3$CN: 1.0%, CH$_4$: 1.0%, H$_2$: remainder | 6 | 900 |
| | | TiCN (second stage) | TiCl$_4$: 4.2%, CH$_3$CN: 0.6%, N$_2$: 20%, H$_2$: remainder | 8 | 900 |
| | | TiN (third stage) | TiCl$_4$: 4.2%, N$_2$: 20%, H$_2$: remainder | 10 | 900 |
| M | After depositing a small amount of TiN, remove only the TiN in the vicinity of a cutting edge with a brush, form TiC, and subsequently form a first Ti compound layer' by changing gas conditions and the pressure of a reaction atmosphere to TiN forming conditions in three stages. | TiN (small amount) | TiCl$_4$: 4.2%, N$_2$: 20%, H$_2$: remainder | 10 | 900 |
| | | TiC (first stage) | TiCl$_4$: 4.2%, CH$_4$: 8.5%, H$_2$: remainder | 7 | 1000 |
| | | TiCN (second stage) | TiCl$_4$: 4.2%, CH$_3$CN: 1.0%, N$_2$: 20%, H$_2$: remainder | 6 | 900 |
| | | TiN (third stage) | TiCl$_4$: 4.2%, N$_2$: 20%, H$_2$: remainder | 10 | 900 |

TABLE 10

| | | | | First Ti compound layer 2, first Ti compound layer 2' | | | | | | | | |
|---|---|---|---|---|---|---|---|---|---|---|---|---|
| | | | | First Ti compound layer 2 in vicinity of cutting edge | | | | | | First Ti compound layer 2" at position of flank face away from cutting edge | | |
| | | | | Component concentration in direction perpendicular to surface of cutting tool substrate | | | | | | Component concentration in direction perpendicular to surface of cutting tool substrate | | |
| | | | | Nitrogen concentration (at %) | | | Average concentration gradient | Average concentration gradient | Average nitrogen | Average layer | Nitrogen concentration (at %) | | |
| Kind | | Cutting tool substrate symbol | Forming symbol | Position A | Position B | Position C | BA (at %/μm) | CB (at %/μm) | concentration (at %) | thickness (mm) | Position A | Position B | Position C |
| Present invention coated tool | 15 | A | J | 28 | 34 | 39 | 75 | 63 | 34 | 0.3 | 29 | 34 | 39 |
| | 16 | A | K | 28 | 34 | 39 | 75 | 63 | 34 | 0.3 | 28 | 34 | 39 |
| | 17 | A | L | 20 | 32 | 43 | 150 | 138 | 32 | 0.3 | 20 | 32 | 43 |
| | 18 | A | L | 20 | 32 | 43 | 150 | 138 | 32 | 1 | 21 | 32 | 43 |
| | 19 | A | L | 20 | 32 | 43 | 150 | 138 | 32 | 0.23 | 20 | 32 | 43 |
| | 20 | A | L | 20 | 32 | 43 | 150 | 138 | 32 | 0.3 | 21 | 32 | 43 |
| | 21 | A | L | 20 | 32 | 43 | 150 | 138 | 32 | 0.3 | 20 | 32 | 43 |
| | 22 | A | M | 1 | 22 | 44 | 263 | 275 | 22 | 0.3 | 1 | 22 | 44 |
| | 23 | B | J | 27 | 34 | 39 | 88 | 63 | 33 | 0.3 | 27 | 34 | 39 |
| | 24 | B | L | 25 | 33 | 42 | 100 | 113 | 33 | 0.3 | 25 | 33 | 42 |
| | 25 | C | J | 26 | 34 | 39 | 100 | 63 | 33 | 0.3 | 28 | 34 | 39 |
| | 26 | C | L | 26 | 34 | 42 | 100 | 100 | 34 | 0.3 | 26 | 34 | 42 |
| | 27 | A | L | 26 | 34 | 42 | 100 | 100 | 34 | 0.3 | 27 | 34 | 42 |
| | 28 | A | L | 26 | 34 | 42 | 100 | 100 | 34 | 0.3 | 26 | 34 | 42 |

TABLE 10-continued

| | | First Ti compound layer 2, first Ti compound layer 2' | | | | | | |
|---|---|---|---|---|---|---|---|---|
| | | First Ti compound layer 2" at position of flank face away from cutting edge | | | | | | Difference in average nitrogen concentration between first Ti compound layer 2 and first Ti compound layer 2" (at %) |
| | | Component concentration in direction perpendicular to surface of cutting tool substrate | | | | Average nitrogen concentration (at %) | Average layer thickness (μm) | |
| | | High nitrogen region | | Low nitrogen region | | | | |
| | Kind | Nitrogen concentration (at %) | Nitrogen concentration (at %) | Nitrogen concentration (at %) | Nitrogen concentration (at %) | | | |
| Present invention coated tool | 15 | 39 | 12 | 29 | 21 | 38 | 0.35 | 4 |
| | 16 | 50 | 0 | 28 | 22 | 40 | 0.35 | 6 |
| | 17 | 38 | 12 | 20 | 30 | 36 | 0.35 | 4 |
| | 18 | 37 | 13 | 21 | 29 | 36 | 1.05 | 4 |
| | 19 | 38 | 12 | 20 | 30 | 36 | 0.28 | 4 |
| | 20 | 39 | 11 | 21 | 29 | 37 | 0.35 | 5 |
| | 21 | 38 | 12 | 20 | 30 | 36 | 0.35 | 4 |
| | 22 | 50 | 0 | 1 | 49 | 35 | 0.35 | 13 |
| | 23 | 36 | 14 | 27 | 23 | 37 | 0.35 | 4 |
| | 24 | 37 | 13 | 25 | 25 | 37 | 0.35 | 4 |
| | 25 | 38 | 12 | 28 | 22 | 37 | 0.35 | 4 |
| | 26 | 38 | 12 | 26 | 24 | 38 | 0.35 | 4 |
| | 27 | 38 | 12 | 27 | 23 | 38 | 0.35 | 4 |
| | 28 | 38 | 12 | 26 | 24 | 38 | 0.35 | 4 |

Next, in a state in which each of the present invention coated tools 15 to 28 was screwed to a tip end portion of an insert holder made of tool steel by a fixing tool, under the same cutting conditions as those of Example 1, a wet intermittent cutting work test of duplex stainless steel was conducted, and the flank face wear width (mm) was measured and visually observed to check the damage state in the vicinity of the cutting edge and the damage state at the position of the flank face away from the cutting edge.

Table 11 shows the results.

TABLE 11

| Kind | | Flank face wear width (mm) | Visual observation results |
|---|---|---|---|
| Present invention coated tool | 15 | 0.08 | Peeling and adhesion-induced chipping absent |
| | 16 | 0.07 | Peeling and adhesion-induced chipping absent |
| | 17 | 0.08 | Peeling and adhesion-induced chipping absent |
| | 18 | 0.08 | Peeling and adhesion-induced chipping absent |
| | 19 | 0.09 | Peeling and adhesion-induced chipping absent |
| | 20 | 0.1 | Peeling and adhesion-induced chipping absent |
| | 21 | 0.08 | Peeling and adhesion-induced chipping absent |
| | 22 | 0.07 | Peeling and adhesion-induced chipping absent |
| | 23 | 0.1 | Peeling and adhesion-induced chipping absent |
| | 24 | 0.08 | Peeling and adhesion-induced chipping absent |
| | 25 | 0.09 | Peeling and adhesion-induced chipping absent |
| | 26 | 0.1 | Peeling and adhesion-induced chipping absent |
| | 27 | 0.18 | Peeling and adhesion-induced chipping absent |
| | 28 | 0.17 | Peeling and adhesion-induced chipping absent |

From the results shown in Table 11, in the present invention coated tools 15 to 28, in addition to the effects by the first Ti compound layer 2, since the first Ti compound layer 2" is formed at the position of the flank face away from the cutting edge, the occurrence of adhesion-induced chipping and peeling is further prevented.

As is apparent from the cutting test results shown in Table 8 and Table 11, the present invention coated tools 1 to 14 and 15 to 28 do not cause the occurrence of adhesion-induced chipping and peeling during intermittent cutting work on a difficult-to-cut material such as duplex stainless steel and exhibit excellent wear resistance for a long-term usage, thereby achieving an increase in the service life of the coated tool.

INDUSTRIAL APPLICABILITY

As described above, the coated tool of the present invention exhibits not only excellent cutting performance during intermittent cutting work on duplex stainless steel but also excellent cutting performance for a long-term usage without causing the occurrence of adhesion-induced chipping, peeling, and the like during intermittent cutting work during which a high load is exerted on the edge tip of various difficult-to-cut materials, thereby achieving an increase in the service life.

REFERENCE SIGNS LIST

1: cutting tool substrate
2: first Ti compound layer (first layer)

2': first Ti compound layer (first layer)
2": first Ti compound layer (first layer)
3: second Ti compound layer (second layer)
4: $Al_2O_3$ layer
5: TiC region or TiCN region having low nitrogen concentration
6: TiN region or TiCN region having high nitrogen concentration
7: low nitrogen region (TiC or TiCN region having low nitrogen concentration formed in direction parallel to surface of cutting tool substrate)
8: high nitrogen region (TiN or TiCN region having high nitrogen concentration formed in direction parallel to surface of cutting tool substrate)
L: direction parallel to surface of cutting tool substrate for measuring high nitrogen region and low nitrogen region

The invention claimed is:

1. A surface-coated cutting tool comprising a hard coating layer on a surface of a cutting tool substrate made of WC-based cemented carbide or TiCN-based cermet, the hard coating layer comprises:
   (a) a Ti compound layer containing at least nitrogen and carbon is formed on the surface of the cutting tool substrate,
   (b) in a vicinity of a cutting edge of the cutting tool substrate, in a case where a nitrogen concentration in the Ti compound layer is measured in a direction perpendicular to the surface of the cutting tool substrate, within a range of 0.20 μm from the surface of the cutting tool substrate toward the Ti compound layer, the nitrogen concentration in the Ti compound layer gradually increases as a distance from the cutting tool substrate increases, and an average concentration gradient of the nitrogen concentration is 20 at %/μm or more and 300 at %/μm or less, and
   (c) an average nitrogen concentration in the Ti compound layer formed on a top of the surface of the cutting tool substrate in the vicinity of the cutting edge is lower than an average nitrogen concentration in the Ti compound layer formed on the top of the surface of the cutting tool substrate at a position of a flank face away from the cutting edge by 3 at % or more.

2. The surface-coated cutting tool according to claim 1, wherein, in the Ti compound layer formed on the top of the surface of the cutting tool substrate at the position of the flank face away from the cutting edge, in a case where a nitrogen concentration and a carbon concentration are measured along a direction parallel to the surface of the cutting tool substrate, a low nitrogen region having a high carbon concentration and a low nitrogen concentration (including zero nitrogen concentration) and a high nitrogen region having a high nitrogen concentration and a low carbon concentration (including zero carbon concentration) are present.

3. The surface-coated cutting tool according to claim 1, further comprising one or more Ti compound layers formed on the surface of the Ti compound layer containing at least nitrogen and carbon and formed on the top of the surface of the cutting tool substrate.

4. The surface-coated cutting tool according to claim 3, further comprising an $Al_2O_3$ layer having an α-form or κ-form crystal structure formed on a surface of the one or more Ti compound layers.

5. The surface-coated cutting tool according to claim 2, further comprising one or more Ti compound layers formed on the surface of the Ti compound layer containing at least nitrogen and carbon and formed on the top of the surface of the cutting tool substrate.

6. The surface-coated cutting tool according to claim 5, further comprising an $Al_2O_3$ layer having an α-form or κ-form crystal structure formed on a surface of the one or more Ti compound layers.

7. The surface-coated cutting tool according to claim 1, wherein the position of the flank face away from the cutting edge is a position 0.4 mm to 0.6 mm away from a honing portion toward the flank face side.

\* \* \* \* \*